US006715862B2

(12) United States Patent  
Takagi et al.

(10) Patent No.: US 6,715,862 B2  
(45) Date of Patent: Apr. 6, 2004

(54) PIEZOELECTRIC INK JET PRINT HEAD AND METHOD OF MAKING THE SAME

(75) Inventors: Atsuhiro Takagi, Kariya (JP); Jun Isono, Nagoya (JP)

(73) Assignee: Brother Kogyo Kabushiki Kaisha, Nagoya (JP)

(*) Notice: Subject to any disclaimer, the term of this patent is extended or adjusted under 35 U.S.C. 154(b) by 0 days.

(21) Appl. No.: 09/983,958

(22) Filed: Oct. 26, 2001

(65) Prior Publication Data

US 2002/0051042 A1 May 2, 2002

(30) Foreign Application Priority Data

| Oct. 26, 2000 | (JP) | 2000-326355 |
| Nov. 10, 2000 | (JP) | 2000-344388 |
| Nov. 28, 2000 | (JP) | 2000-361053 |
| Dec. 5, 2000 | (JP) | 2000-369656 |
| Oct. 25, 2001 | (JP) | 2001-327220 |

(51) Int. Cl.$^7$ .............................................. B41J 2/045
(52) U.S. Cl. .................................................. 347/72
(58) Field of Search ................... 347/71, 72, 68, 347/70

(56) References Cited

U.S. PATENT DOCUMENTS

| 5,265,315 | A | | 11/1993 | Hoisington et al. |
| 5,402,159 | A | | 3/1995 | Takahashi et al. |
| 6,074,047 | A | * | 6/2000 | Hotomi et al. ............... 347/70 |
| 6,134,761 | A | * | 10/2000 | Usui ........................... 347/71 |

* cited by examiner

Primary Examiner—Judy Nguyen  
(74) Attorney, Agent, or Firm—Oliff & Berridge, PLC

(57) ABSTRACT

An ink jet print head includes a cavity plate having a plurality of nozzles and a plurality of pressure chambers communicating with the respective nozzles, and a plate-like piezoelectric actuator, in which piezoelectric sheets having a plurality of electrodes formed at positions with respect to the pressure chambers are stacked one after another. The piezoelectric actuator is bonded to the cavity plate so as to close the pressure chambers in the cavity plate. Each of the piezoelectric sheets has a thickness of between 5–40 μm, preferably between 15–30 μm. Surface electrodes, which electrically connect one of the electrodes, are provided at both end portions of a surface of the piezoelectric actuator, which is opposed to a surface to be bonded to the cavity plate. Protrusions having a thickness of the surface electrodes are provided between the surface electrodes on the surface of the piezoelectric actuator.

7 Claims, 37 Drawing Sheets

FIG. 4　THICKNESS OF ONE PIEZOELECTRIC SHEET AND CHARACTERISTICS

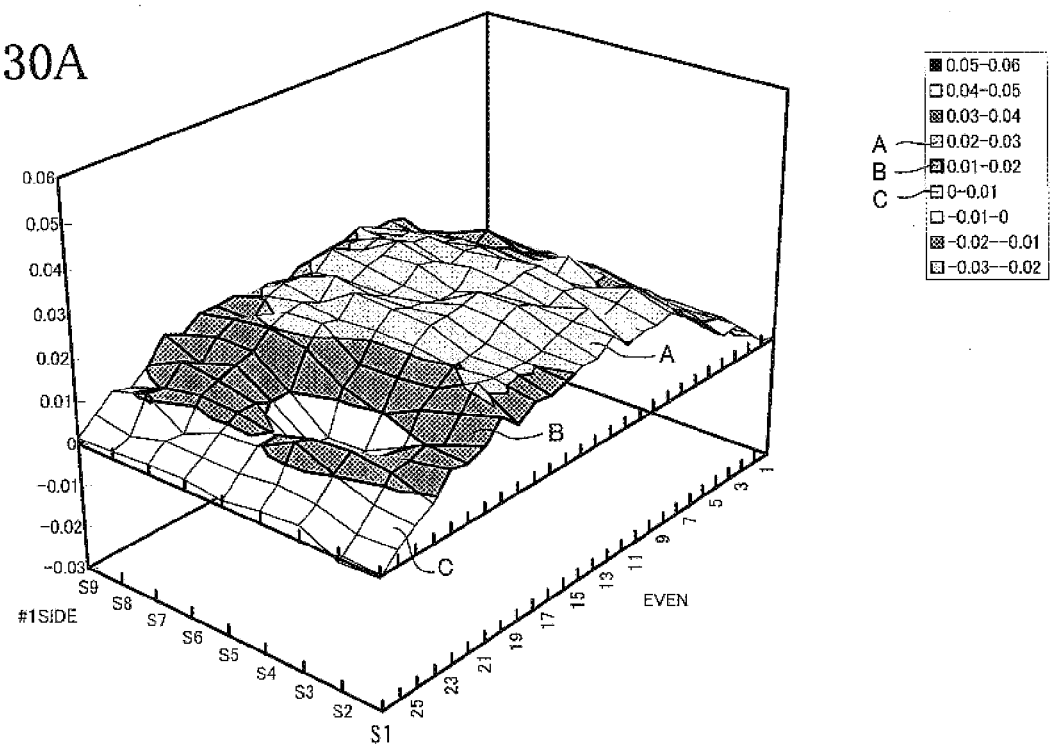

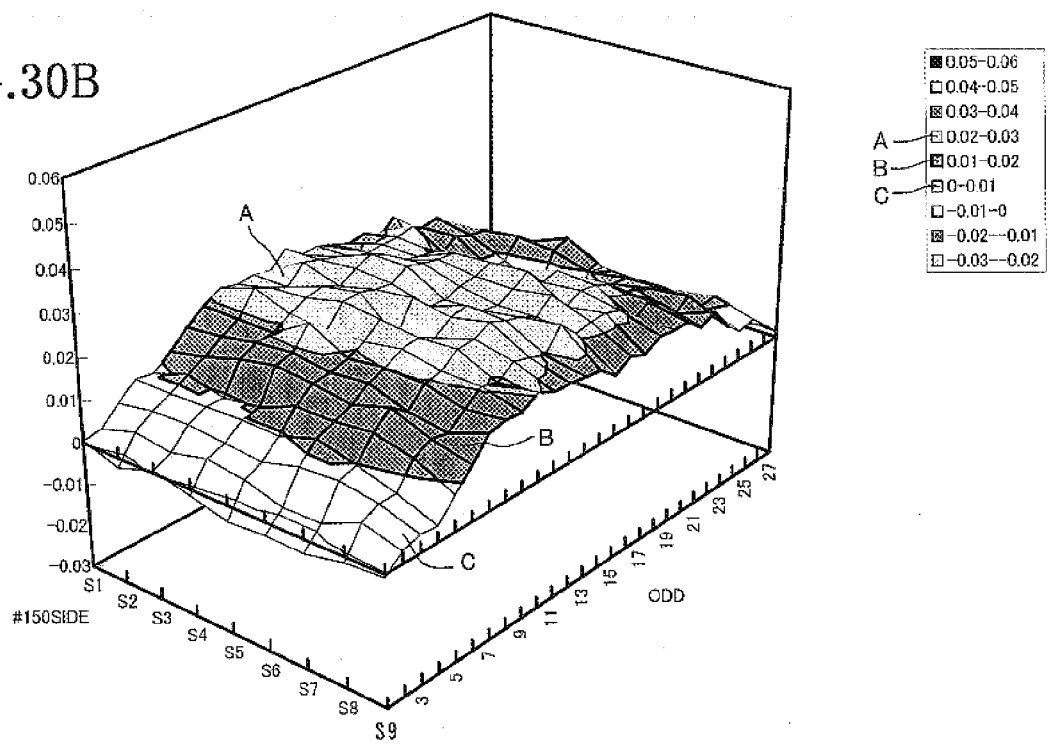

RELATED ART

RELATED ART

RELATED ART

RELATED ART

PIEZOELECTRIC INK JET PRINT HEAD AND METHOD OF MAKING THE SAME

BACKGROUND OF THE INVENTION

1. Field of Invention

The invention relates to a piezoelectric ink jet print head, more particularly, to an ink jet print head using a laminated piezoelectric actuator and a method of fabricating the same.

2. Description of Related Art

Conventionally, an ink jet print head using a laminated piezoelectric actuator has been known.

As shown in FIG. 32, an ink jet print head 300 includes a cavity plate 310 formed by stacking substantially rectangular metal plates, in which a plurality of pressure chambers 316, which extend in a direction perpendicular to a longitudinal direction of the cavity plate 310, are formed so as to be aligned in parallel with the longitudinal direction of the cavity plate 310. A plate-like piezoelectric actuator 320 having a substantially rectangular plate shape is bonded to the cavity plate 110 so as to close the pressure chambers 316. A flat flexible cable 330 for connecting with external equipment is bonded on the piezoelectric actuator 320.

As shown in FIGS. 32 and 33, a plurality of surface electrodes 326, 327 are provided on the piezoelectric actuator 320 at its surface opposite to the surface to be bonded to the cavity plate 310 (an upper surface of the plate-type piezoelectric actuator 320 in FIG. 32). The surface electrodes 326 and 327 are formed on both sides and are connected with driving electrodes and common electrodes, respectively. An oval ink supply hole 319 is provided at a left end portion of the cavity plate 310.

According to the conventional piezoelectric actuator, if the piezoelectric sheet is too thin, metallic material in internal electrodes may be diffused too much during sintering of the piezoelectric sheet. This results in piezoelectric characteristic of the piezoelectric sheet being spoiled.

On the other hand, if the piezoelectric sheet is too thick, restraint of non-active portions have a great effect on active portions. Accordingly, the active portions cannot sufficiently deform.

Further, if the internal electrode is too thin, the electrode becomes too narrow or is cut off due to the diffusion of the metallic material during sintering of the piezoelectric sheet. On the other hand, if the internal electrode is too thick, delamination frequently occurs in an interface between portions having the internal electrodes and portions not having the internal electrodes, because there is a great difference in the thickness of the piezoelectric sheets after lamination.

Referring to FIGS. 34 and 35, adhesion of the plate-like piezoelectric actuator 320 onto the cavity plate 310 in the ink jet print head 300 structured as described above will be described. First, as shown in FIG. 34, the cavity plate 310 is placed on a workbench 370 having a flat surface. Next, the piezoelectric actuator 320, to which an adhesive is applied at its bottom, is placed on the cavity plate 310 on the workbench 370, while checking to make sure that the cavity plate 310 is in proper alignment with the piezoelectric actuator 320. Then, as shown in FIG. 35, a force of 10 kg-weight is applied to the upper surface of the piezoelectric actuator 320, in a direction indicated with an arrow A, using an assembly jig 340 having a flat bottom surface. Thus, the piezoelectric actuator 320 is bonded to the cavity plate 310.

However, in the above-described method of adhering the plate-like piezoelectric actuator 320 to the cavity plate 310, the assembly jig 340 only presses the surface electrodes 326, 327 provided on the surface of the piezoelectric actuator 320. As shown in FIGS. 34 and 35, when there are waves 320a, which are smaller than the thickness of the surface electrodes 326, 327, in a middle of the piezoelectric actuator 320, the waves 320a cannot be flatted using the assembly jig 340. If the waves 320a remain in the piezoelectric actuator 320, an adhesion failure may occur in the piezoelectric actuator 320 and the cavity plate 310. Ink leakage may also occur.

The piezoelectric ink jet print head as described above is typically produced by the following method. First, internal electrodes are screen-printed on piezoelectric sheets, and the piezoelectric sheets having the electrodes and the piezoelectric sheets not having the electrodes are alternatively stacked. The laminated piezoelectric sheets are pressed and sintered. After that, a deformation restraining member is bonded to the laminated piezoelectric sheets using an adhesive.

Further, the piezoelectric actuator fabricated as described above is bonded to the cavity plate having pressure chambers. Finally, the piezoelectric ink jet print head is obtained.

When the piezoelectric actuator is fabricated using such a conventional method, asperities are developed in the surfaces of the piezoelectric actuator and the cavity plate, which are adhered each other, after sintering of the piezoelectric sheets. As a result, an adhesion failure may occur in the piezoelectric actuator and the cavity plate.

Accordingly, grinding is required to be performed on the surface of the piezoelectric actuator after sintering. All of the above lead to problems in operating efficiency and costs in the production and use of piezoelectric ink jet printheads.

SUMMARY OF THE INVENTION

In light of the foregoing, it would be desirable to provide a piezoelectric ink jet print head using a laminated piezoelectric actuator that addresses the foregoing drawbacks associated with other known piezoelectric ink jet print heads.

One aspect of the invention involves a piezoelectric print head that includes a cavity plate and a plate-like piezoelectric actuator. The cavity plate includes a plurality of nozzles and a plurality of pressure chambers communicating with the respective nozzles. The plate-like piezoelectric actuator is formed into a single laminated structure by laminating a plurality of piezoelectric sheets including a plurality of electrodes which are formed at positions so as to be aligned with the respective pressure chambers. The laminated piezoelectric actuator is then sintered and bonded to the cavity plate so as to close the pressure chambers provided in the cavity plate. In the piezoelectric ink jet print head, each of the piezoelectric sheets has a thickness of between 5–40 μm, preferably between 15–30 μm.

According to another aspect of the invention, a piezoelectric ink jet print head includes a cavity plate, a plate-like piezoelectric actuator, surface electrodes and protrusions. The cavity plate includes a plurality of nozzles and a plurality of pressure chambers communicating with the respective nozzles. The plate-like piezoelectric actuator is formed into a single laminated structure by laminating a plurality of piezoelectric sheets including a plurality of electrodes which are formed at positions so as to be aligned with the respective pressure chambers. The laminated piezoelectric actuator is then sintered and bonded to the cavity plate so as to close the pressure chambers provided in the cavity plate. The surface electrodes are provided at an end portion of a surface of the piezoelectric actuator, which is opposed to a surface of the piezoelectric actuator to be bonded to the cavity plate, and are electrically connected with the plurality of electrodes. Each of the protrusions has a thickness of the surface electrodes and is provided on the surface of the piezoelectric actuator where the surface electrodes are provided.

According to yet another aspect of the invention, a piezoelectric ink jet print head includes a cavity plate and a plate-like piezoelectric actuator. The cavity plate includes a plurality of nozzles and a plurality of pressure chambers communicating with the respective nozzles. The plate-like piezoelectric actuator is formed into a single laminated structure by laminating a plurality of piezoelectric sheets including a plurality of electrodes which are formed at positions so as to be aligned with the respective pressure chambers. The laminated piezoelectric actuator is then sintered and bonded to the cavity plate so as to close the pressure chambers provided in the cavity plate. The piezoelectric actuator has a flatness of 30 $\mu$m or less, which is a difference of height between projections and depressions formed on the piezoelectric actuator at its surface to which the cavity plate is bonded.

BRIEF DESCRIPTION OF THE DRAWINGS

Various exemplary embodiments of the invention will be described in detail with reference to the following figures wherein:

FIG. 30A is a three-dimensional view showing a surface of one sample of the piezoelectric actuator, wherein the surface is divided into 208 (8×26) sections;

FIG. 30B shows a three-dimensional surface profiling data viewed from an ODD side shown in FIG. 30A;

DETAILED DESCRIPTION OF PREFERRED EMBODIMENTS

Various exemplary embodiments of the invention will be described with reference to the accompanying drawings.

A first embodiment of the invention will be described with reference to FIGS. 1 to 8.

Figure 1:
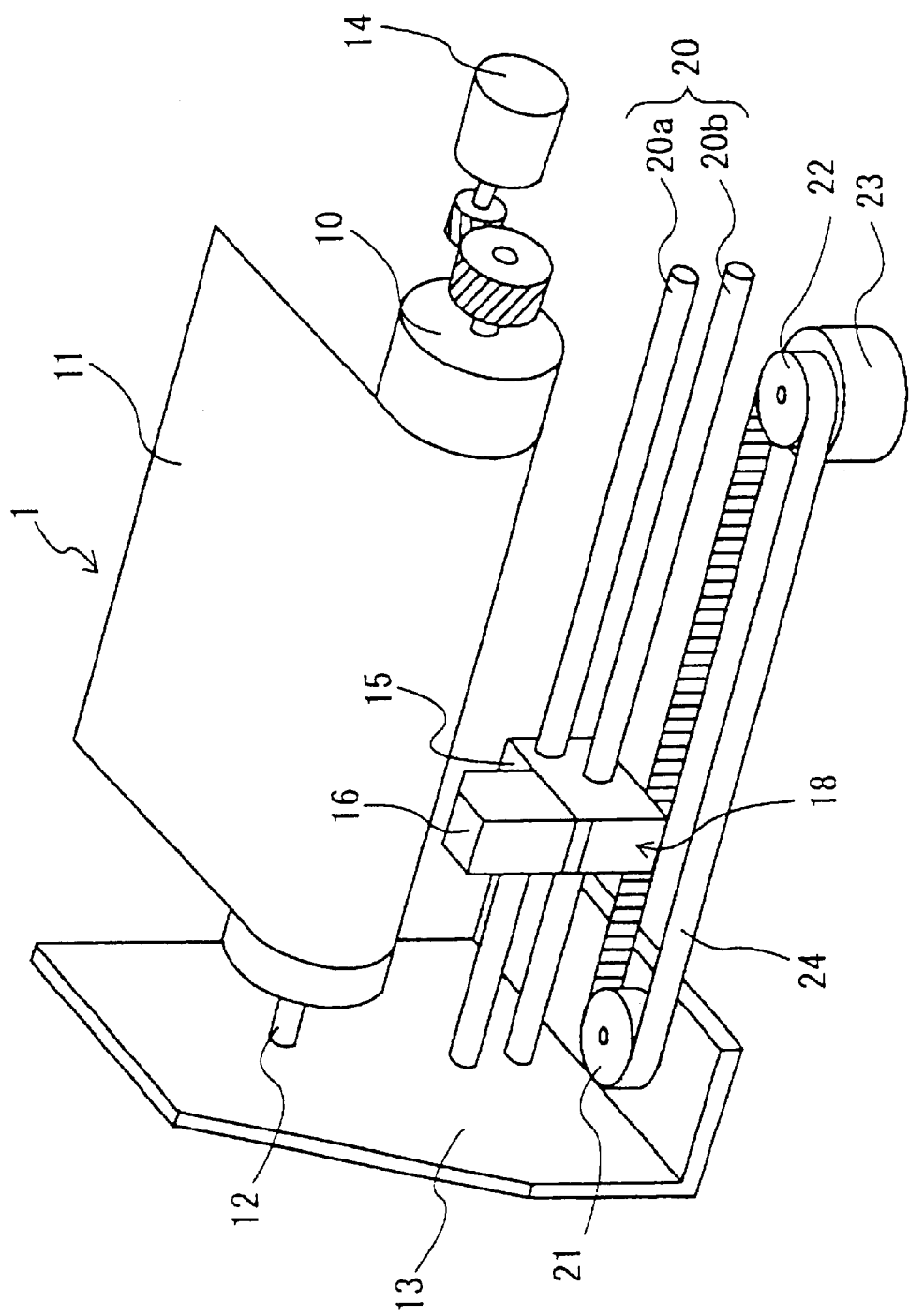
FIG. 1 is a perspective view of essential parts of an ink jet printer, in which a piezoelectric ink jet print head of the invention is used.

With reference to FIG. 1, the ink jet printer 1 includes a horizontal platen 10 for feeding a sheet 11 perpendicularly to its axis. The platen 10 includes a shaft 12, which is rotatably supported by a frame 13, and can be rotated by a motor 14 via a drive gear train. A piezoelectric ink jet print head 15 is provided to be opposed to the platen 10.

The piezoelectric ink jet print head 15 is disposed on a carriage 18 with an ink supply device 16. A pair of guide rods 20 (20*a* and 20*b*) extend below the platen 10 and in parallel to its shaft 12, and are fixed to the frame 13. The guide rods 20 slidably support the carriage 18, which is connected to a timing belt 24. The timing belt 24 extends between a driven pulley 21 and a driving pulley 22, which can be rotated by a motor 23 to drive the timing belt 24. Thus, the timing belt 24 can slide the carriage 18 on the guide rods 20 along the platen 10, with the piezoelectric ink jet print head 15 facing the platen 10.

The piezoelectric ink jet print head 15 includes a cavity plate 30 and a piezoelectric actuator 3, which consists of an active layer 38 and a restraining layer 70. The cavity plate 30 has three ink channels 32*a*, 32*b*, 32*c* formed therein and each having an open top. The ink channels 32*a*, 32*b*, 32*c* function as an ink chamber. The cavity plate 30 also has three orifices 37*a*, 37*b*, 37*c* formed through its bottom and communicating with the ink channels 32*a*, 32*b* and 32*c*, respectively.

The active layer 38 lies on the top of the cavity plate 30. The active layer 38 includes six piezoelectric sheets 40*a*, 40*b*, 40*c*, 40*d*, 40*e*, 40*f* laminated or stacked together and each having an electrode pattern formed on their upper sides. The piezoelectric sheets 40*a* to 40*f* each have an electrostrictive effect. The electrostrictive effect of the active layer 38 changes the volume of the ink channels 32*a*, 32*b*, 32*c* to eject through the orifices 37*a*, 37*b*, 37*c*, respectively, the ink stored in these channels. The restraining layer 70 lies on the top of the active layer 38 and is formed integrally with the active layer 38. The restraining layer 70 includes three piezoelectric sheets 71*a*, 71*b*, 71*c* laminated or stacked together. The restraining layer 70 restrains the active layer 38 from deforming upward when the active layer 38 is driven. The restraining layer 70 makes the whole piezoelectric actuator 3 more rigid to prevent cross talk.

Figure 7:
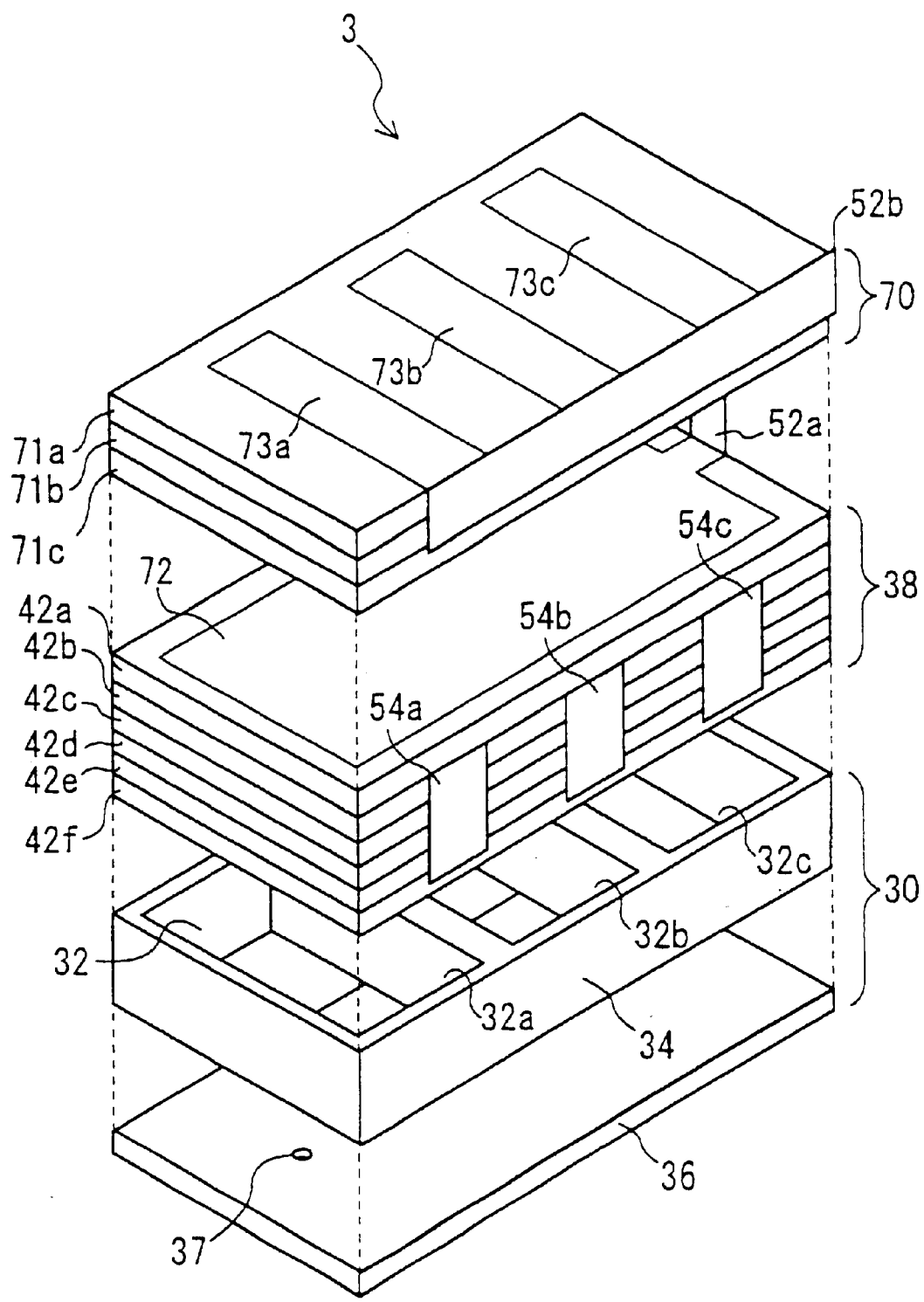
FIG. 7 is a disassembled perspective view of essential parts of the piezoelectric ink jet print head of FIG. 2.

As shown in FIG. 7, the cavity plate 30 includes a channel body 34, which is formed in a rectangular parallelepiped. In the channel body 34, the ink channels 32*a*, 32*b*, 32*c* are formed in parallel and spaced at regular intervals. Each of the ink channels 32*a*, 32*b*, 32*c* has a width of about 250 $\mu$m and a height of 60 $\mu$m. On the bottom of the channel body 34, an orifice plate 36 is disposed so as to cover its bottom. The orifice plate 36 is formed with orifices 37 so as to be aligned with the respective ink channels 32*a*, 32*b*, 32*c* for ejecting the ink. The channel body 34 and the orifice plate 36 are made of iron material, for example, and bonded together though other materials could be used. For example, the channel body 34 and orifice plate 36 might be integrally molded by sintering ceramics or the like, or injection-molding alumina or similar material. Each of the ink channels 32*a*, 32*b*, 32*c* is always filled with ink by being supplied through a supply passage (not shown) communicating with the ink supply device 16 (see FIG. 8).

A negative pressure is applied to the ink in the ink channels 32*a*, 32*b*, 32*c* so that the surface tension of ink outwardly produces concave menisci of ink in the orifices 37*a*, 37*b*, 37*c*. This normally prevents ink from leaking through the orifices 37*a*, 37*b*, 37*c*, but allows ink to be ejected through them only when the internal pressure in the ink channels 32*a*, 32*b*, 32*c* rises. The orifices 37*a*, 37*b*, 37*c* might be replaced by nozzles extending from the respective ink channels 32*a*, 32*b*, 32*c*. The nozzles could be angled to adjust the direction of ink ejection from the ink channels 32*a*, 32*b*, 32*c*. The orifices 37*a*, 37*b*, 37*c* might be positioned elsewhere than the bottoms of the ink channels 32*a*, 32*b*, 32*c*.

Figure 6:
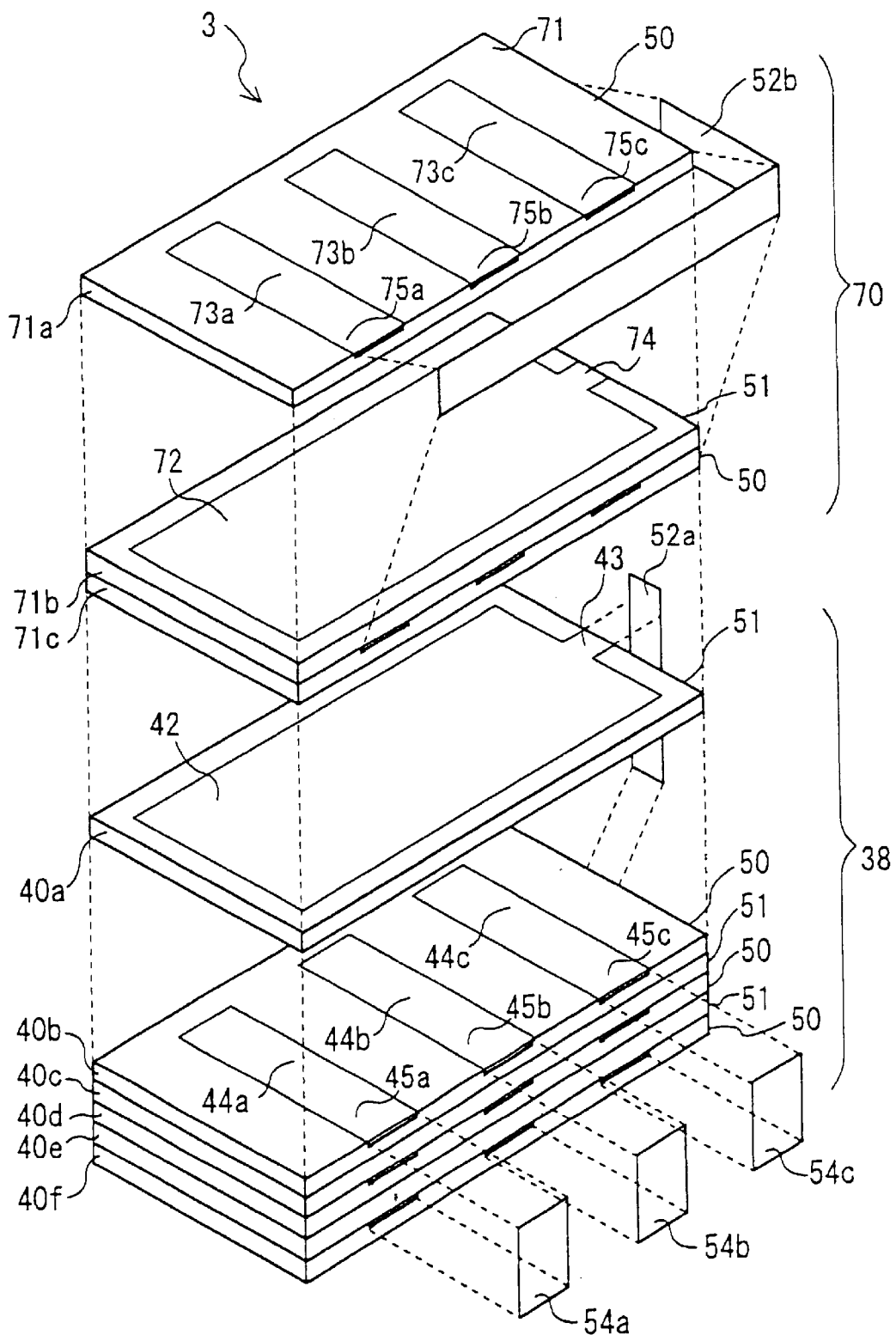
FIG. 6 is a disassembled perspective view of the piezoelectric actuator, showing a structure of an active layer and a restraining layer.

As shown in FIG. 6, each of the three piezoelectric sheets 40*a*, 40*c*, 40*e* of the active layer 38 has an internal negative electrode 42 and a connector 43 which are formed on its upper side as stated later on. The connector 43 connects the negative electrode 42 electrically to the outside. The negative electrode 42 covers the substantial portion except a peripheral portion of the upper side of the associated piezoelectric sheet 40*a*, 40*c* or 40*e*. Likewise, each of the other three piezoelectric sheets 40*b*, 40*d*, 40*f* of the active layer 38 has three internal positive electrodes 44*a*, 44*b*, 44*c* and three connectors 45*a*, 45*b*, 45*c* formed on its upper side. The connectors 45*a*, 45*b*, 45*c* electrically connect the internal positive electrodes 44*a*, 44*b*, 44*c*, respectively, to the outside. The internal positive electrodes 44*a*, 44*b*, 44*c* are associated with the ink channels 32*a*, 32*b*, 32*c* (FIG. 7), respectively, and extend in parallel. Each of the internal positive electrodes 44*a*, 44*b*, 44*c* takes the form of a belt or band and has a width of about 120 $\mu$m. When designing the ink jet print head, a pitch of the channels affects the width of the internal positive electrodes as the driving electrode. In other words, the width of the pressure chamber in the cavity plate determines the width of the driving electrodes. It is preferable to set a width of the driving electrodes to 40–70% of the width of the pressure chamber. If it is narrower than 40% of the width of the pressure chamber, enough pressure changes are not obtained with respect to the volume of the pressure chamber. This may cause unstable ink ejection. On the contrary, if it is wider than 70% of the width of the pressure chamber, the deformation of the piezoelectric sheet may be restricted due to the bonding area between the piezoelectric sheet and the cavity beam. The deformation near the bonding area will not contribute to the pressure change. But this may cause a crosstalk of the pressure changes among the neighboring channels. On the other hand, when considering the design of the ink jet print head, it is preferable to set the resolution of the ink head, which is a pitch of the channels, to 85 $\mu$m corresponding to 300 dpi, to 847 $\mu$m corresponding to 30 dpi, more preferably to 169 $\mu$m corresponding to 150 dpi, or to 508 $\mu$m corresponding to 50 dpi. When the pressure chambers are arranged with a narrower pitch of under 85 $\mu$m, the width of the beam is required to be between about 10–20 $\mu$m, which does not provide an enough bonding area with the piezoelectric sheet. When the pressure chambers are arranged with a wider pitch of over 847 $\mu$m, the frequency or number of scans of the ink head should be increased to obtain a fine print quality. This may result in the ink jet printer not operating any more. Therefore, based on the target resolution of the ink jet print head and considering the beam width and the efficiency of the pressure changes, the width of the driving electrodes is set to between 50–500 $\mu$m to achieve resolutions of 30–300 dpi, and, preferably between 80–200 $\mu$m to achieve resolutions of 50–150 dpi. In addition, because the electrodes are formed by screen printing a paste made of Ag—Pd metallic material onto the piezoelectric sheet, it would be difficult to form a strip of electrode narrower than 50 $\mu$m. Therefore, it is preferable to form a strip of electrode wider than 80 $\mu$m.

The internal negative electrode 42 and the positive electrodes 44*a*, 44*b*, 44*c* are also made of Ag—Pd metallic material and each have a thickness of about between 0.7–5 m, preferably between 1–3 µm.

The piezoelectric sheets 40a–40f with the two types of electrode patterns printed on them are alternately laminated or stacked.

Figure 2:
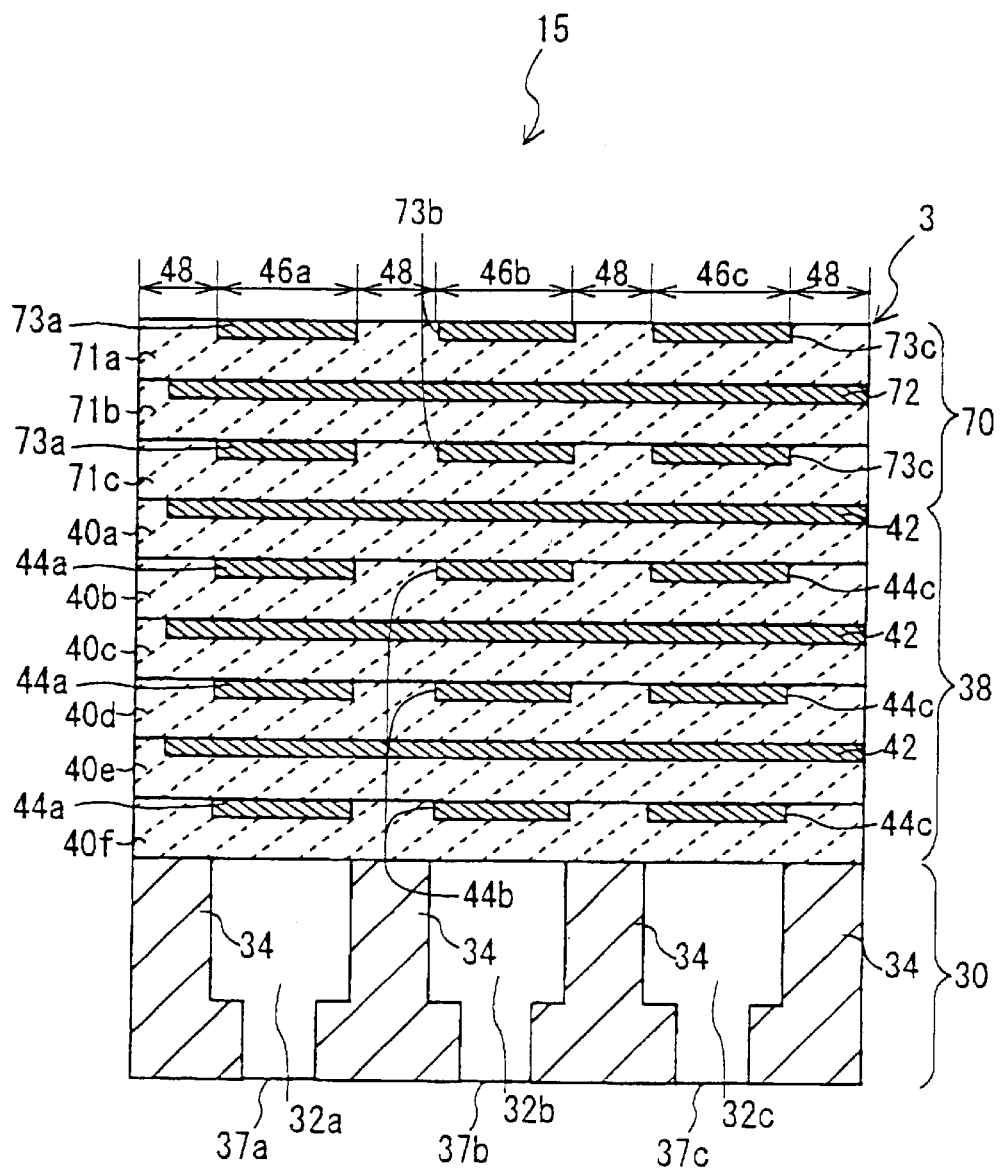
FIG. 2 is a sectional view of essential parts of the piezoelectric ink jet print head of a first embodiment of the invention.

Thus, as shown in FIG. 2, one internal negative electrode 42 is positioned on one side of each of the piezoelectric sheets 40a, 40c, 40e, while three internal positive electrodes 44a, 44b, 44c are positioned on one side of each of the piezoelectric sheets 40b, 40d, 40f. Each of the six piezoelectric ceramic sheets 40a to 40f consists of piezoelectrically active portions 46a, 46b, 46c and piezoelectrically inactive portions 48. Each of the active portions 46a, 46b, 46c of the five sheets 40a to 40e is formed between the adjacent negative electrode 42 and one of the adjacent positive electrodes 44a, 44b, 44c, each of which takes the form of a belt or band. Each of the active portions 46a, 46b, 46c of the bottom sheet 40f is formed under one of the adjacent positive electrodes 44a, 44b, 44c. Each of the active portions 46a, 46b, 46c has a width of about 120 µm. The other portions of the six piezoelectric sheets 40a to 40f are the inactive portions 48. When voltage is applied between the positive electrodes 44a, 44b or 44c and the negative electrodes 42, electric fields are generated in the associated active portions 46a, 46b or 46c, which then deform vertically due to the electrostrictive effect, while no electric field is generated in the inactive portions 48, which do not deform. The channel body 34 is fixed to the bottom of the active layer 38 in such a manner that the active portions 46a, 46b, 46c are positioned over or above the ink channels 32a, 32b, 32c, respectively.

Figure 3:
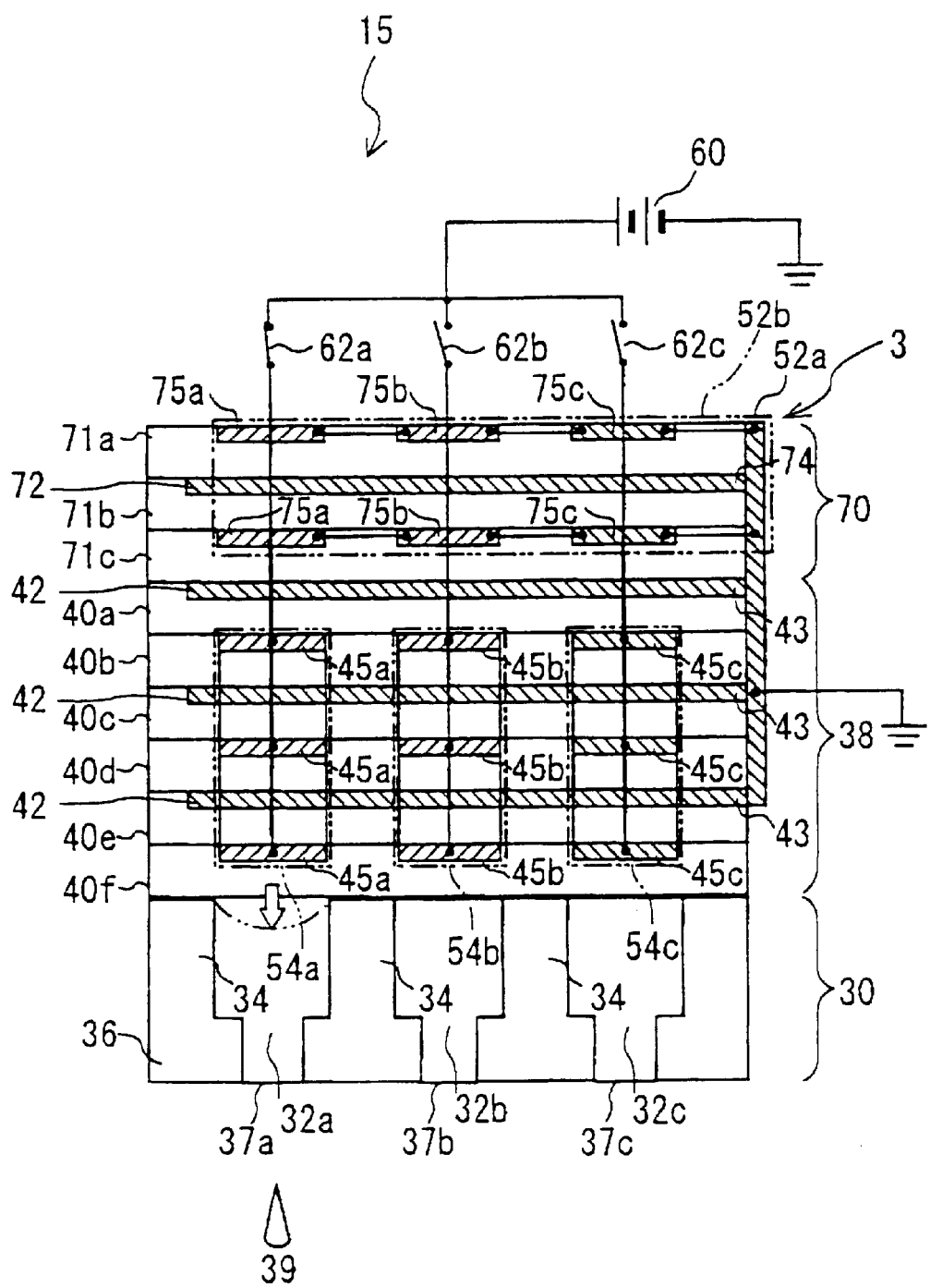
FIG. 3 is an electric connection or wiring diagram of a piezoelectric actuator of the piezoelectric ink jet print head of FIG. 2.

The restraining layer 70 includes three piezoelectric sheets 71a, 71b, 71c, which are identical in structure and material and equal in size to the piezoelectric sheets 40a to 40f of the active layer 38. As shown in FIGS. 2, 3 and 6, each of the top and bottom piezoelectric sheets 71a and 71c of the restraining layer 70 has three dummy positive electrodes 73a, 73b, 73c and three connectors 75a, 75b, 75c, which are identical in structure to the internal positive electrodes 44a, 44b, 44c and the connectors 45a, 45b, 45c, respectively, on the piezoelectric sheets 40b, 40d, 40f. The middle piezoelectric sheet 71b of the restraining layer 70 has a dummy negative electrode 72 and a connector 74, which are identical in structure to the internal negative electrodes 42 and the connectors 43, respectively, on the piezoelectric sheets 40a, 40c, 40e.

The active layer 38 and the restraining layer 70 are produced by the following method. First, ceramic powder of ferroelectric lead zirconate titanate (PZT ($PbTiO_3 \cdot PbZrO_3$)) material, a binder and a solvent are mixed into a mixed liquid having a viscosity between 10,000 and 30,000 CPS. The mixed liquid is spread and dried on films of polyethylene terephthalate (PET) or other plastic material to form piezoelectric sheets.

In the embodiment, each of the piezoelectric sheets has a thickness of between 5–40 µm, preferably between 15–30 µm.

Metallic material is screen-printed on those portions of five of the piezoelectric sheets which will be the internal positive electrodes 44a, 44b, 44c, the dummy positive electrodes 73a, 73b, 73c and the connectors 45a, 45b, 45c, 75a, 75b, 75c. These sheets will be the piezoelectric sheets 40b, 40d, 40f, 71a, 71c. Likewise, metallic material is screen-printed on those portions of the other four of the piezoelectric sheets which will be the internal negative electrodes 42, the dummy negative electrode 72 and the connectors 43, 74. These sheets will be the piezoelectric sheets 40a, 40c, 40e, 71b.

The nine piezoelectric sheets 40f, 40e, 40d, 40c, 40b, 40a, 71c, 71b, 71a are stacked one after another, in this order, from below upward, with the piezoelectric sheet 40f positioned at the bottom. At this stage, the active layer 38 and the restraining layer 70 are not yet distinguished.

The stacked piezoelectric sheets are pressed with heat, degreased and sintered to form a piezoelectric ceramic block, which consists of the active layer 38 and restraining layer 70.

The sintering of the piezoelectric sheets stacked as a laminated block will be explained below.

As stated already, the piezoelectric actuator 3 consists of an active layer 38 and a restraining layer 70. Electrodes are essential to the active layer 38, while the restraining layer 70 functionally needs to have no electrode. When the laminated block is sintered, however, the piezoelectric ceramics differ in shrinking percentage from the metallic material for the electrodes. Even a slight difference in shrinking percentage may warp or wave the sintered active layer 38, thereby damaging or spoiling its flatness. The non-flat active layer 38 can be bonded less closely (with lower adherence) to the cavity plate 30. This may cause a problem that ink leaks from the ink channels 32a, 32b, 32c, so that defective products may be produced. This may also cause a problem that the active layer 38 needs regrinding (or needs to be ground again), so that the number of producing process steps may increase and the production costs may be higher. Non-flat active layer 38 may further cause a problem that gaps between the active layer 38 and the cavity plate 30 need filling with fillers, which may reduce the strength of the laminated block.

Therefore, as stated earlier, the restraining layer 70 and the active layer 38 are made of the same piezoelectric ceramic material so that they are equal in shrinking percentage when the ceramics are sintered. The dummy negative electrode 72, the connector 74, the dummy positive electrodes 73a, 73b, 73c and the connectors 75a, 75b, 75c, which are formed on the ceramic sheets 71a, 71b, 71c of the restraining layer 70, are identical to the internal negative electrodes 42, the connectors 43, the internal positive electrodes 44a, 44b, 44c and the connectors 45a, 45b, 45c, respectively, on the piezoelectric ceramic sheets 40a to 40f of the active layer 38, but do not contribute to deformation of the restraining layer 70. Therefore, because the active layer 38 and the restraining layer 70 have the very same structure, they can be identical in shrinking percentage when they are sintered. The internal electrodes 42, 44a, 44b, 44c, 72, 73a, 73b, 73c and the connectors 43, 45a, 45b, 45c, 74, 75a, 75b, 75c of the active and restraining layers 38, 70 of the laminated block as a whole are arrayed in vertical symmetry (symmetrically in the directions of lamination). This symmetrizes the shrinking percentage of the whole laminated block so as not to warp this block being sintered.

As shown in FIG. 3, the piezoelectric actuator 3 includes an external negative electrode 52a made of electrically conductive metallic material. This external electrode 52a electrically connects the connectors 43 on the three piezoelectric sheets 40a, 40c, 40e and the connector 74 on the piezoelectric sheet 71b. The piezoelectric actuator 3 includes another external negative electrode 52b made of an electrically conductive metal plate. This external electrode 52b electrically connects the connectors 75a, 75b, 75c on the piezoelectric sheets 71a, 71c. These external electrodes 52a and 52b are electrically connected. Consequently, the dummy electrodes 72, 73a, 73b, 73c on the piezoelectric sheets 71a, 71b, 71c and the internal negative electrodes 42 on the piezoelectric ceramic sheets 40a, 40c, 40e are equal in electric potential.

The piezoelectric actuator 3 also includes three external positive electrode 54a, 54b, 54c made of electrically conductive metallic material. The external electrode 54a electrically connects the connectors 45a on the piezoelectric sheets 40b, 40d, 40f. The external electrode 54b electrically connects the connectors 45b on the piezoelectric ceramic sheets 40b, 40d, 40f. The external electrode 54c electrically connects the connectors 45c on the piezoelectric ceramic sheets 40b, 40d, 40f. The external negative electrodes 52a, 52b and the positive electrodes 54a, 54b, 54c are formed out of metallic material, which is printed directly on side faces of the active layer 38 and the restraining layer 70, or with which these faces are coated directly. Alternatively, the external electrodes might be metal plates connected in contact with the connectors 43, 45a, 45b, 45c, 74, 75a, 75b, 75c, or wires soldered to these connectors. These electrodes might have other structures.

Because the dummy electrodes 72, 73a, 73b, 73c do not contribute to deformation of the piezoelectric sheets 71a, 71b, 71c of the restraining layer 70, it is not necessary to apply a drive voltage to these electrodes. Even if the dummy electrodes 72, 73a, 73b, 73c and the connectors 74, 75a, 75b, 75c were insulated in order not to be electrically polarized, a potential difference might be generated between them and the top internal negative electrode 42 of the active layer 38. The potential difference produces an electric capacity, which produces an electric current. The current is so small as not to contribute to deformation of the piezoelectric sheets 71a, 71b, 71c, but results in a power loss. In particular, if the power source for the piezoelectric actuator 3 is a battery, the power loss shortens the life of the battery. Therefore, the dummy electrodes 72, 73a, 73b, 73c and the connectors 74, 75a, 75b, 75c are connected electrically to the internal negative electrodes 42 of the active layer 38. This prevents a potential difference from being generated between the dummy electrodes 72, 73a, 73b, 73c and the connectors 74, 75a, 75b, 75c of the restraining layer 70 and the top internal negative electrode 42 of the active layer 38. It is consequently possible to prevent the production of a needless capacity.

The laminated block thus constructed is then immersed in an oil bath (not shown) filled with a silicone oil or another insulating oil at a temperature of about 130° C. An electric field of about 2.5 kv/mm is applied between the external negative electrode 52a and the external positive electrodes 54a, 54b, 54c to polarize the piezoelectric sheets 40a, 40b, 40f of the active layer 38.

As shown in FIG. 3, the external negative electrode 52a is grounded via a cord (not shown) to have a ground potential. The external positive electrodes 54a, 54b, 54c are connected to the positive pole of a power source 60, using a cord (not shown), via switches 62a, 62b, 62c, respectively. The negative pole of the power source 60 is grounded. When a controller (not shown) makes one or more of the switches 62a, 62b, 62c closed, a drive voltage is applied between the associated internal positive electrodes 44a, 44b, 44c and the internal negative electrodes 42 from the power source 60.

As shown in FIG. 7, the block consisting of the active layer 38 and the restraining layer 70, and the cavity plate 30 are assembled into the piezoelectric ink jet print head 15 (FIG. 2).

Figure 8:
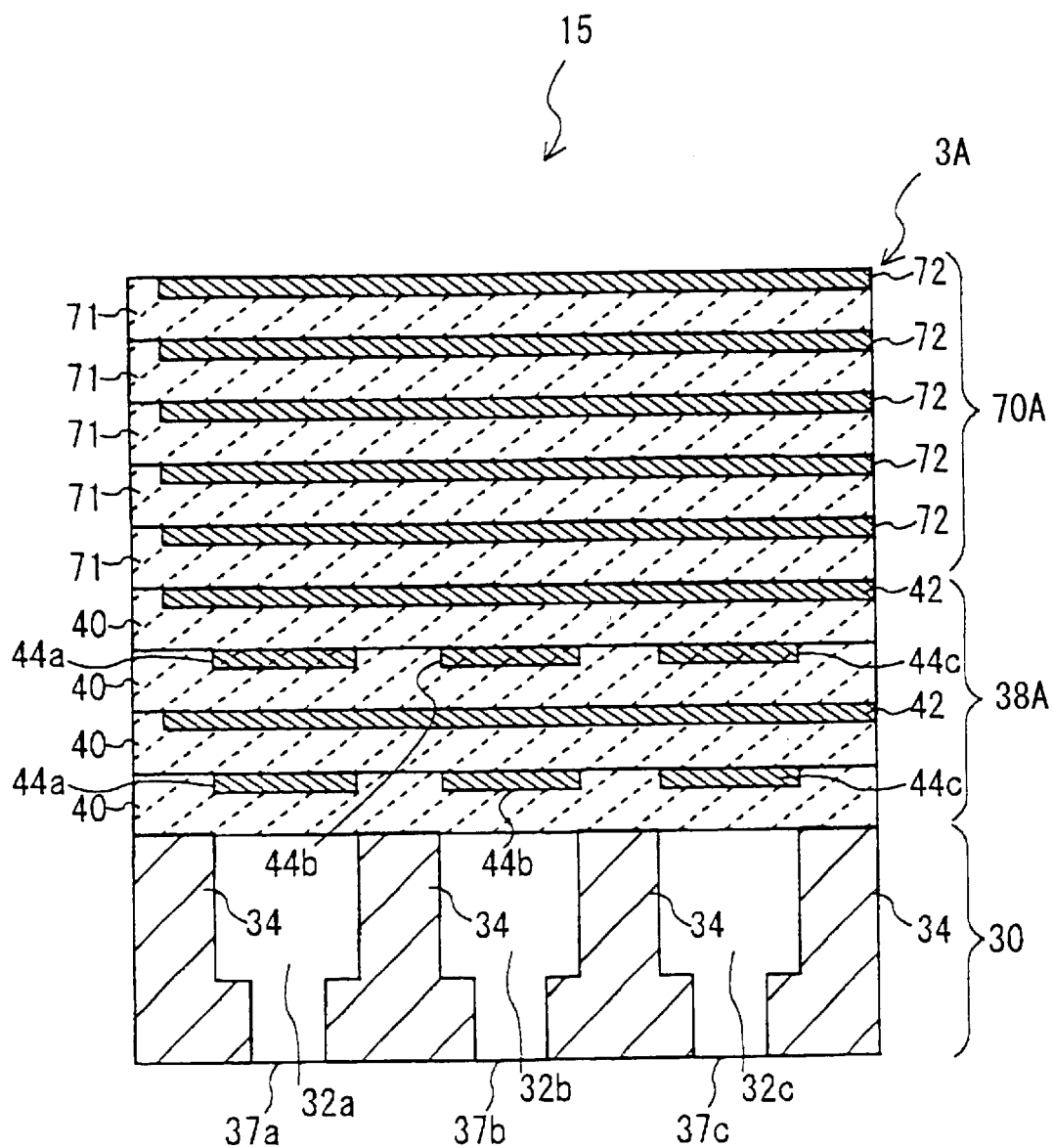
FIG. 8 is a sectional view of a modification of a piezoelectric actuator to be used in the piezoelectric ink jet print head of FIG. 2.
Figure 9:
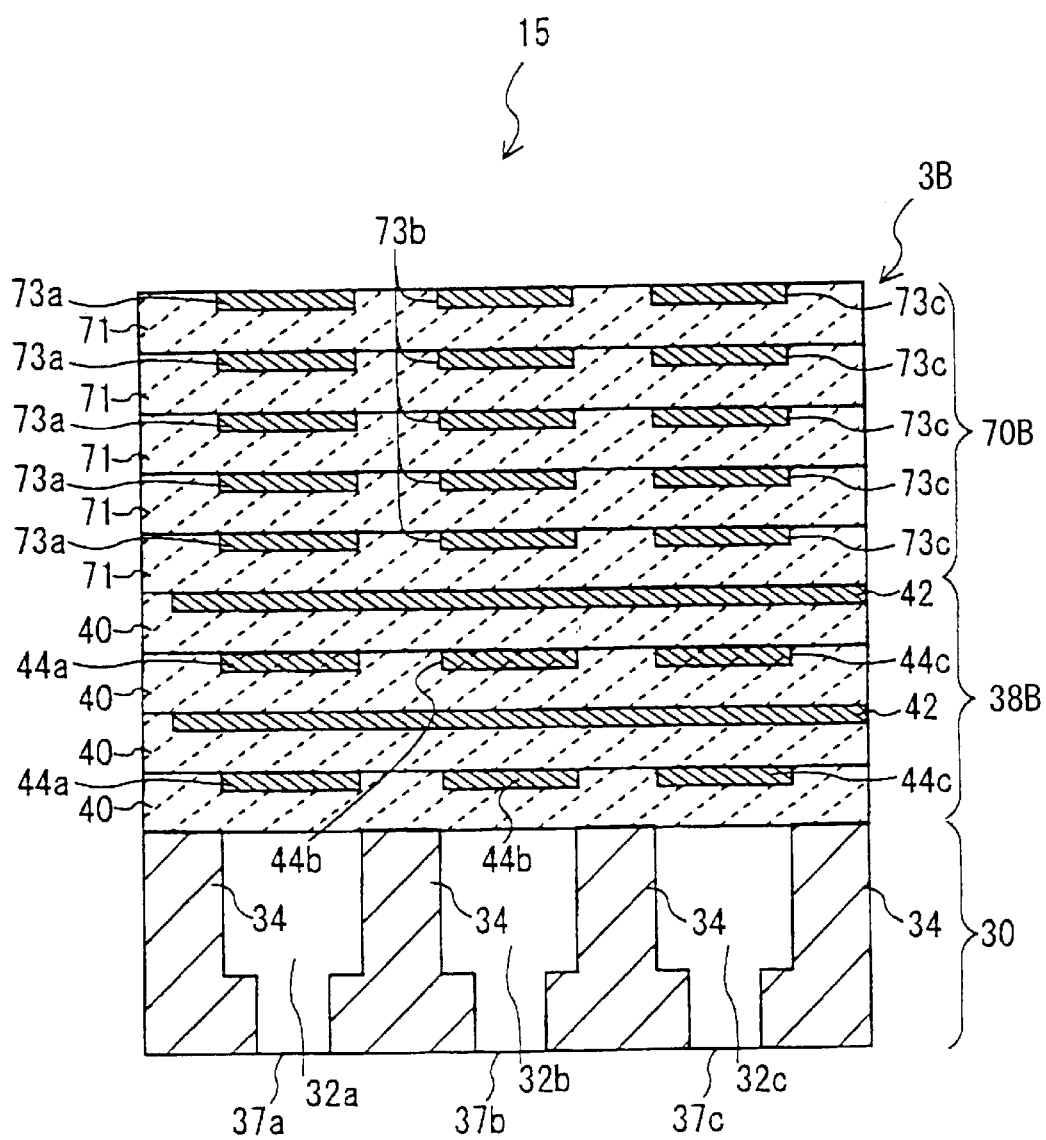
FIG. 9 is a sectional view of another modification of a piezoelectric actuator to be used in the piezoelectric ink jet print head of FIG. 2.

FIGS. 8 and 9 show modified piezoelectric actuators 3A and 3B, respectively. In FIGS. 8 and 9, parts identical to the counterparts of the piezoelectric actuator 3 are assigned the same reference numerals without being described.

With reference to FIG. 8, as is the case with the piezoelectric actuator 3, the modified piezoelectric actuator 3A consists of an active layer 38A and a restraining layer 70A. The active layer 38A of the piezoelectric actuator 3A includes four piezoelectric sheets 40. The restraining layer 70A includes five piezoelectric sheets 71, on each of which a dummy negative electrode 72 is formed. Each dummy negative electrode 72 is grounded through a ground electrode. As shown in FIG. 2, the active layer 38 of the piezoelectric actuator 3 includes six piezoelectric sheets 40a to 40f. The active layer 38A of the piezoelectric element 3A differs from the active layer 38 in including four piezoelectric sheets 40. As shown in FIG. 6, the restraining layer 70 of the piezoelectric actuator 3 includes the three piezoelectric sheets 71a, 71b, 71c, which are alternately stacked and sintered. As shown in FIG. 8, the restraining layer 70A of the piezoelectric actuator 3A has five piezoelectric sheets 71, which are identical in structure to the piezoelectric sheets 40a, 40b, 40c, 71b. The piezoelectric sheets 71 are stacked and sintered, and then the dummy electrodes 72 are formed thereon. The number of piezoelectric sheets 40 of the active layer 38A and the number of piezoelectric sheets 71 of the restraining layer 70A might vary under various conditions. If the shrinking percentage during sintering of the electrodes provided as the dummy electrodes is within a certain range where the restraining layer 70 is prevented from warping, this restraining layer 70 could include only the piezoelectric sheets that are identical in structure to the piezoelectric sheets 40a, 40b, 40c, 71b.

With reference to FIG. 9, as is the case with the modified piezoelectric actuator 3A, the modified piezoelectric actuator 3B includes an active layer 38B including four piezoelectric sheets 40. The piezoelectric actuator 3B also includes a restraining layer 70B including five piezoelectric sheets, each of which has three dummy positive electrodes 73a, 73b, 73c formed on it. The piezoelectric sheets are stacked and sintered. The dummy electrodes 73a, 73b, 73c are grounded through a ground electrode. As is the case with the piezoelectric actuator 3A described above, if the shrinking percentage during sintering of the dummy positive electrodes is within a certain range where the restraining layer 70 is prevented from warping, this restraining layer 70 could include only the piezoelectric sheets that are identical in structure to the piezoelectric sheets 40a, 40b, 40c, 71b.

The operation of the piezoelectric actuator 3 will be described below with reference to FIGS. 2 and 3.

When the controller causes the switch 62a, for example, to be closed in accordance with certain print data, voltage is applied between the internal negative electrodes 42 and the internal positive electrodes 44a, generating electric fields in the piezo-electrically active portions 46a of the piezoelectric sheets 40a to 40f. Consequently, the electrostrictive effects of the piezoelectric sheets develop force with which the active portions 46a tend to vertically expand, in FIG. 2. In the meantime, because no electric field is generated in the piezoelectric sheets 71a, 71b, 71c of the restraining layer 70, these sheets 71a, 71b, 71c do not expand nor contract. Therefore, the force with which the active portions 46a tend to vertically expand deforms the active layer 38 mainly downward. As indicated with an arrow in FIG. 3, the downward deformed active layer 38 reduces the volume of the ink channel 32a. This ejects an ink droplet 39 from the ink channel 32a through the orifice 37a. When the switch 62a is opened to cut off the voltage application, the piezoelectrically active portions 46a return to their original conditions. This enlarges the ink channel 32a, thereby supplying it with ink from the supply device 16 (FIG. 1) through a valve (not shown).

Without the restraining layer 70, the deformation of the piezo-electrically active portions 46a would deform the active layer 38 equally upward and downward. When the restraining layer 70 is provided as the piezoelectric actuator 3 of the embodiment, the restraining layer 70, which is highly rigid, and the active layer 38 are sintered into one piece. Even when the switch 62a is closed, no electric field is generated in the restraining layer 70, which does therefore not deform. Consequently, the deformation caused in the active layer 38 mainly deforms the lower side of this layer 38, which is adjacent to the ink channel 32a. Accordingly, the lower side of the piezoelectric actuator 3 can be deformed larger than that of a piezoelectric actuator without a restraining layer 70, if the piezo-electrically active portions of these actuator deform equally in amount. This makes it possible to reduce the capacity of the ink channel 32a and eject a larger amount of ink. That is to say, even with the same voltage applied, the provision of the restraining layer 70 makes it possible to eject a larger amount of ink. In other words, it is possible to eject a certain amount of ink by applying a lower voltage. This results in smaller electric power.

In the embodiment, as described above, the thickness of the piezoelectric sheets 40, 71, on which the electrodes and the like are printed, is between 5–40 $\mu$m. Thus, excellent piezoelectric characteristics can be obtained and the active layer 38 can sufficiently deform. Relationship between the thickness of the piezoelectric sheet and the piezoelectric characteristics and between the thickness of the piezoelectric sheet and the deformation of the active layer will be described with reference to FIG. 4.

Figure 4:
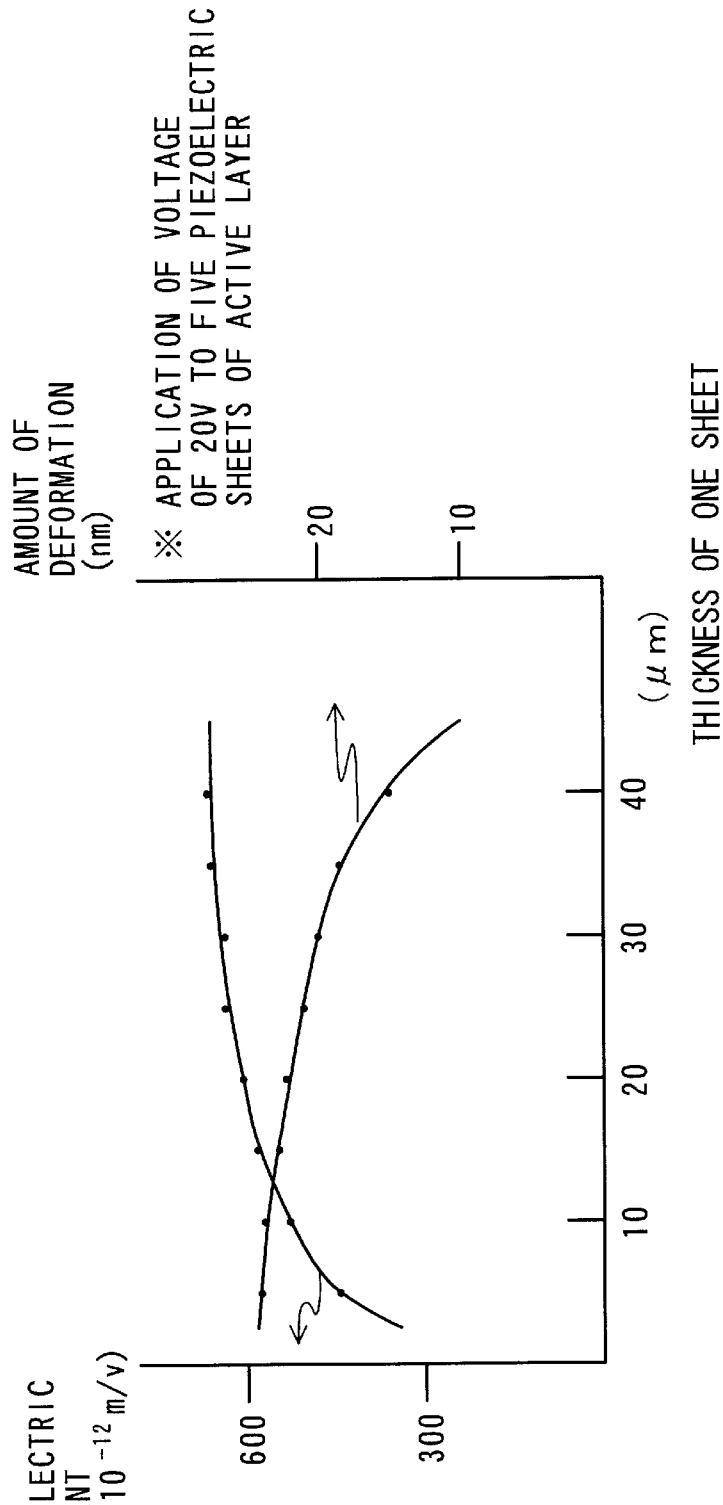
FIG. 4 is a graph showing relationships between a thickness of a piezoelectric sheet and a voltage constant and between the thickness of the piezoelectric sheet and an amount of deformation of the piezoelectric sheet, in the piezoelectric actuator in the piezoelectric ink jet print head of FIG. 2.

As shown in FIG. 4, when the thickness of the piezoelectric sheet is 15 $\mu$m or more, the piezoelectric constant d33 is about 600($\times 10^{-12}$ m/V). Therefore, the excellent characteristics can be obtained.

However, when it is less than 5 $\mu$m, the piezoelectric constant d33 is less than 450($\times 10^{-12}$ m/V), so that the sufficient characteristics cannot be obtained.

This is because when the thickness of the piezoelectric sheet is less than 5 $\mu$m, the silver (Ag) in the electrodes diffuses too much during sintering. Accordingly, piezoelectric sufficient characteristics cannot be obtained as described above.

Therefore, in the embodiment, the thickness of the one piezoelectric sheet is 5 $\mu$m or more, preferably, 15 $\mu$m or more. Thus, sufficient piezoelectric characteristics can be obtained in the active layer 38.

As shown in FIG. 4, when thickness of the piezoelectric sheet is 30 $\mu$m or less, the amount of deformation of the active layer 38 is 20 nm or more. The amount of deformation shown in FIG. 4 is that which occurs when the voltage of 20V is applied to five piezoelectric sheets of the active layer 38.

As can be seen from FIG. 4, when piezoelectric sheet thickness exceeds 40 $\mu$m, the amount of deformation of the active layer 38 is 13 $\mu$m or less. Therefore, sufficient deformation cannot be obtained.

This is because when the thickness of the piezoelectric sheet exceeds 40 $\mu$m, the restraint of the non-active portions have a great effect on the active portions. Accordingly, the active portions cannot sufficiently deform.

Thus, in the embodiment, the thickness of the piezoelectric sheet is 40 $\mu$m or less, preferably 30 $\mu$m or less. As a result, a sufficient amount of deformation can be obtained in the active layer 38.

In the embodiment, as described above, the internal negative electrode 42 and the internal positive electrodes 44a, 44b, 44c each have the thickness of about between 0.7–5 $\mu$m, preferably between 1–3 $\mu$m. Therefore, the electrodes do not become too narrow and are not cut off. Delamination hardly occurs at the interface between the portions having the internal electrodes and the portions not having the internal electrodes. Relationships between a thickness of an internal electrode and a capacitance will be described with reference to FIG. 5.

Figure 5:
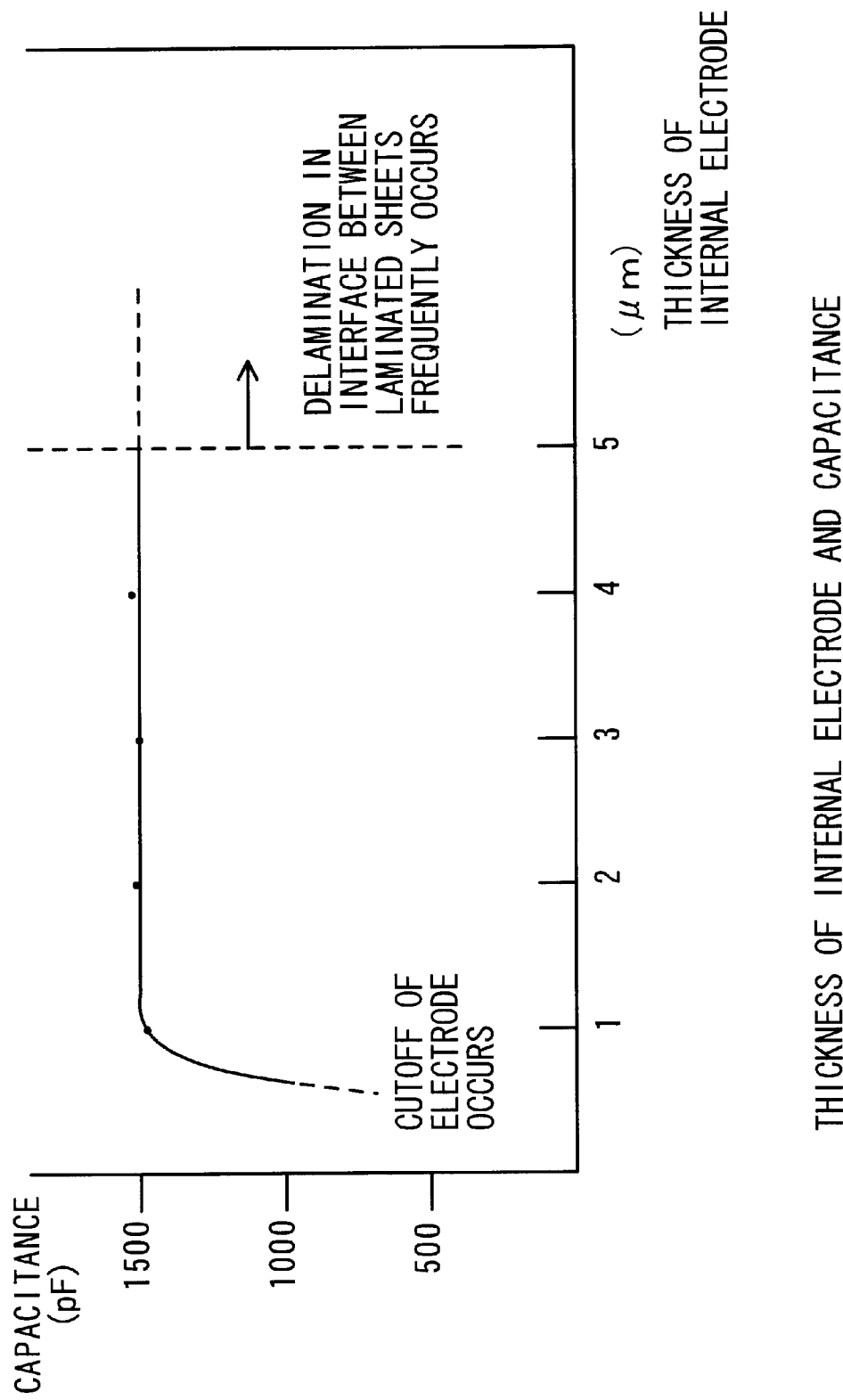
FIG. 5 is a graph showing relationships between a thickness of an internal electrode and a capacitance, in the piezoelectric actuator in the piezoelectric ink jet print head of FIG. 2.

As shown in FIG. 5, when the thickness of an internal electrode is 1 $\mu$m or more, the capacitance of 1600 pF can be obtained. Therefore, an electrode having a sufficient width can be formed.

However, when the thickness of the internal electrode is less than 0.7 $\mu$m, the capacitance is less than 1500 pF, and the electrode becomes narrow. Further, when it is less than 0.5 $\mu$m, the capacitance is less than 500 pF, thereby causing the electrode to be cut off.

This occurs because when the thickness of the internal electrode is less than 0.7 $\mu$m, the silver (Ag) in the electrodes diffuses during sintering. Accordingly, the electrode becomes too narrow or is cut off.

Thus, in the embodiment, the thickness of the internal electrode film is 0.7 $\mu$m or more, preferably 1 $\mu$m or more. As a result, the internal negative electrode 42 and the internal positive electrodes 44a, 44b, 44c having sufficient width can be formed.

As shown in FIG. 5, when the internal electrode thickness exceeds 5 $\mu$m, delamination frequently occurs at the interface between the portions having the internal electrodes and the portions not having the internal electrodes.

This is because when the thickness of the internal electrode film exceeds 5 $\mu$m, the difference of the thickness between the portions having the internal electrodes and the portions not having the internal electrodes, in the piezoelectric sheet, is too great.

Accordingly, in the embodiment, the thickness of the internal electrode is 5 $\mu$m or less, preferably 3 $\mu$m or less. As a result, the electrodes having sufficient width can be obtained and delamination at the interface between the laminated piezoelectric sheets can be prevented.

As described above, in the embodiment, the thickness of the one piezoelectric sheet is between 5–40 $\mu$m, preferably between 15–30 $\mu$m, thereby excellent piezoelectric characteristics and a desired amount of deformation can be obtained in the active layer 38. Accordingly, ejection characteristics of each ink chamber becomes stable and the ejection characteristics can be prevented from variation.

As described above, the thickness of the internal electrode is between 0.7–5 $\mu$m, preferably between 1–3 $\mu$m. Thus, physical defects traceable to the electrodes can be prevented, so that original piezoelectric characteristics can be obtained.

In the exemplary embodiments described above, a piezoelectric element that actuates in an extension mode has been described. However, the scope of the invention is not restricted to such as that described above. The same concepts can be applied to a piezoelectric element with any mode, such as an unimorph mode, a bimorph mode, and a share mode. Further, in the embodiments described above, as shown in FIGS. 2, 3, 8 and 9, the bottom sheet of the piezoelectric actuator 15 has the internal positive electrode 44a. However, the internal negative electrode 42 can be provided onto the bottom sheet by changing the order of the laminated layers. As shown in FIGS. 8 and 9, in order to improve the stiffness of the actuator and the efficiency of deformation of each channel, the piezoelectric actuator 15 is provided with the restraining layer 70A or 70B. In the embodiments described thus far, the restraining layer 70A, 70B also has the electrodes, however, these electrodes can be omitted to make a layer which does not have any electrode.

Another embodiment of the invention will be described with reference to FIGS. 10 to 20.

Figure 10:
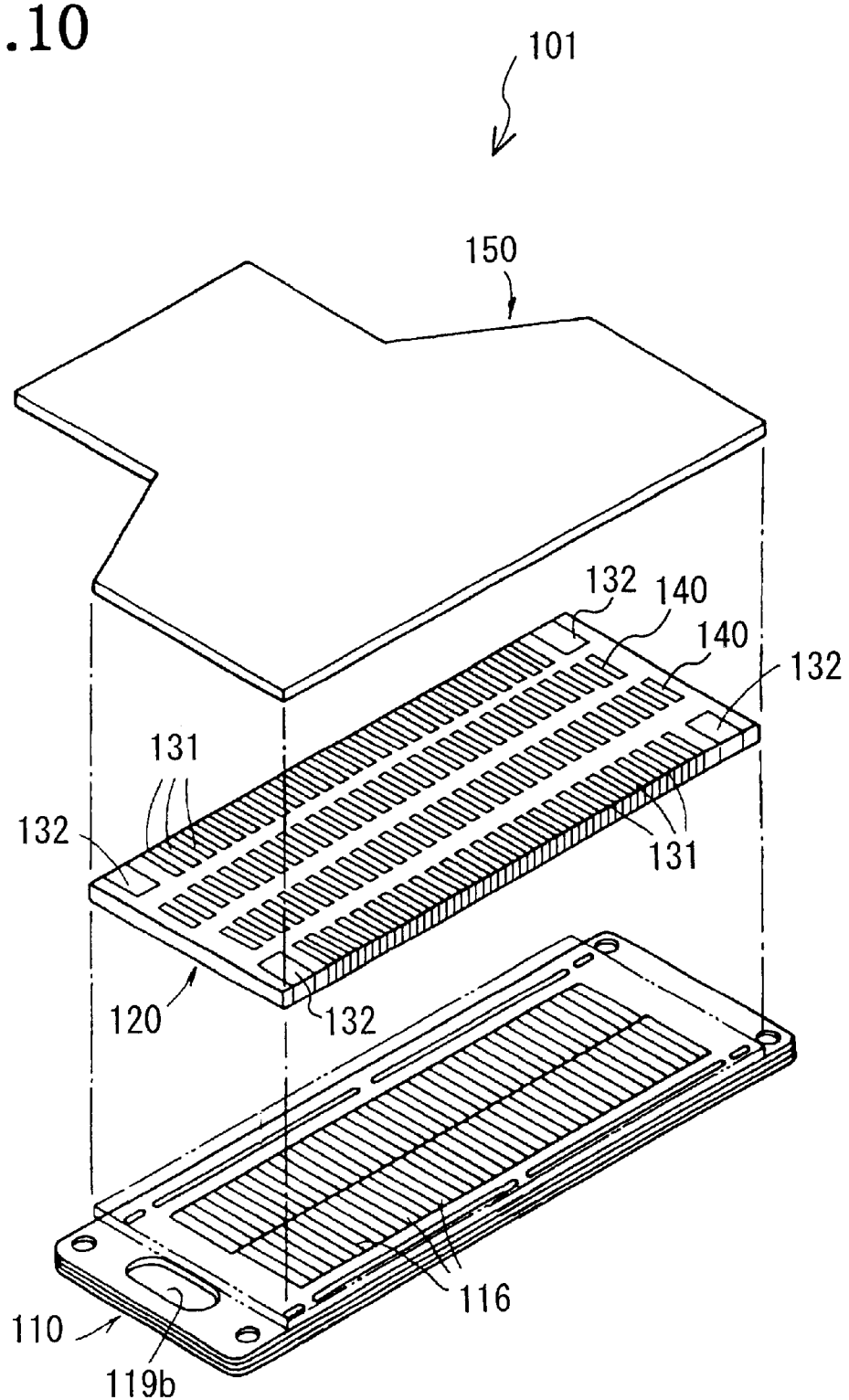
FIG. 10 is a disassembled perspective view of an ink jet print head of a second embodiment of the invention.

As shown in FIG. 10, an ink jet print head 101 includes a cavity plate 110 formed by stacking substantially rectangular metal plates, in which a plurality of pressure chambers 116, which extend in a direction perpendicular to a longitudinal direction of the cavity plate 110, are formed so as to be aligned in parallel with the longitudinal direction of the cavity plate 110. A plate-like piezoelectric actuator 120 having a substantially rectangular plate shape is bonded to the cavity plate 110 so as to close the pressure chambers 116. A flat flexible cable 150 for connecting with external equipment is bonded on the piezoelectric actuator 120.

Figure 11:
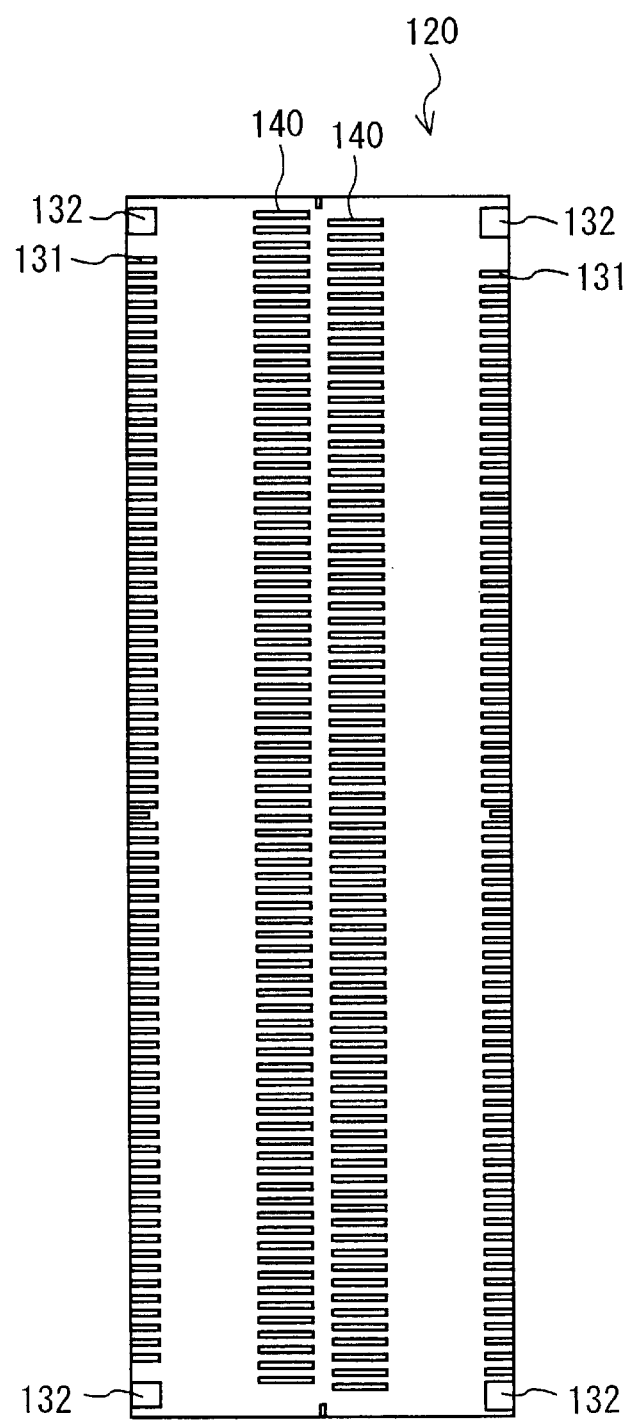
FIG. 11 is a plan view of a plate-like piezoelectric actuator to be used in the ink jet print head of FIG. 10.

As shown in FIGS. 10 and 11, surface electrodes 131, 132 are provided on piezoelectric actuator 120 at its surface opposite to the surface to be bonded to the cavity plate 110 (an upper surface of the plate-like piezoelectric actuator 120 in FIG. 10). The surface electrodes 131 and 132 connect with driving electrodes 136 described later and common electrodes 135 described later, respectively. In addition, pseudo electrodes 140 described later are aligned in two rows on the surface of the piezoelectric actuator 120.

Figure 12:
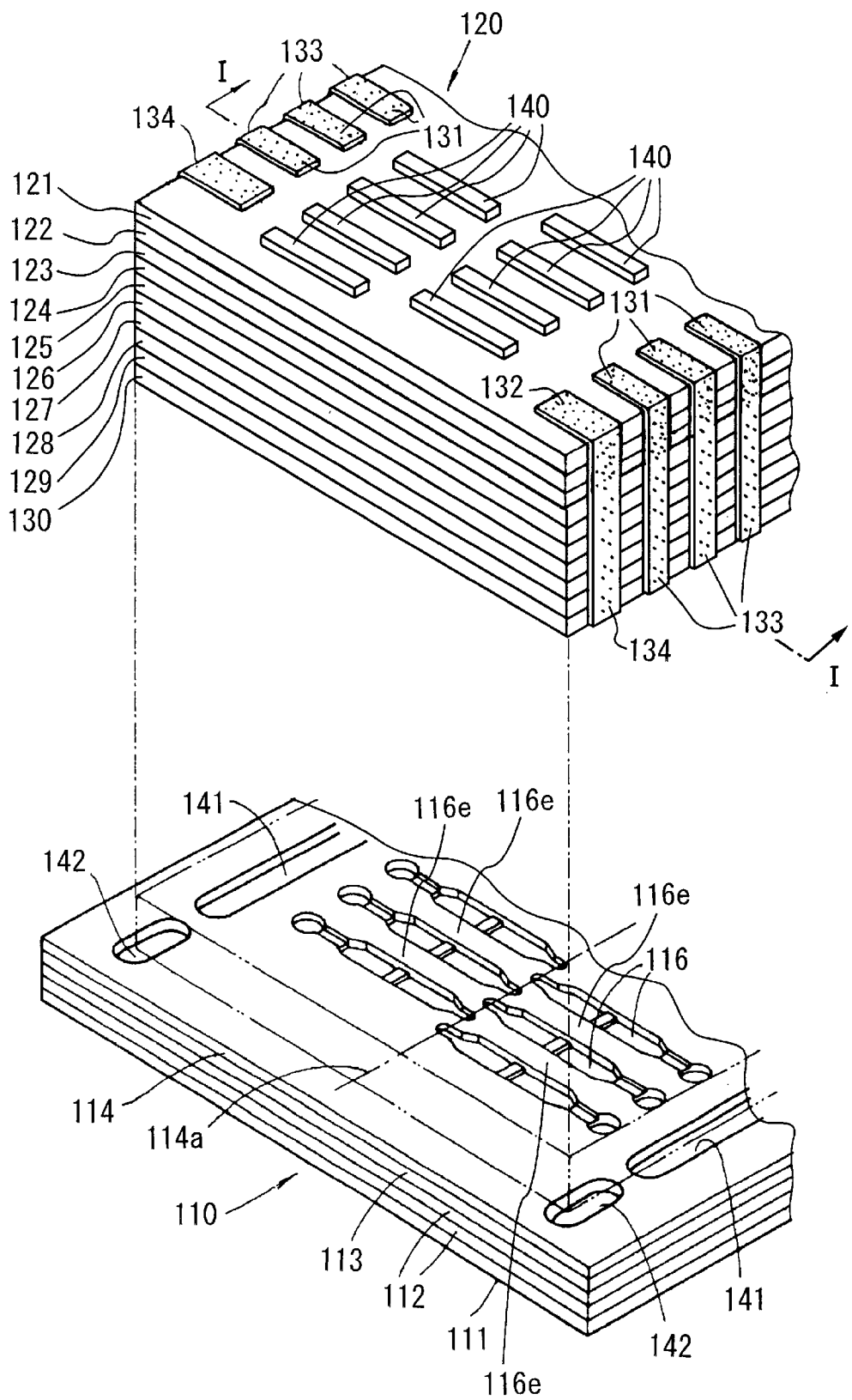
FIG. 12 is a perspective view of the plate-like piezoelectric actuator and a cavity plate, wherein the piezoelectric actuator is separated from the cavity plate.
Figure 13:
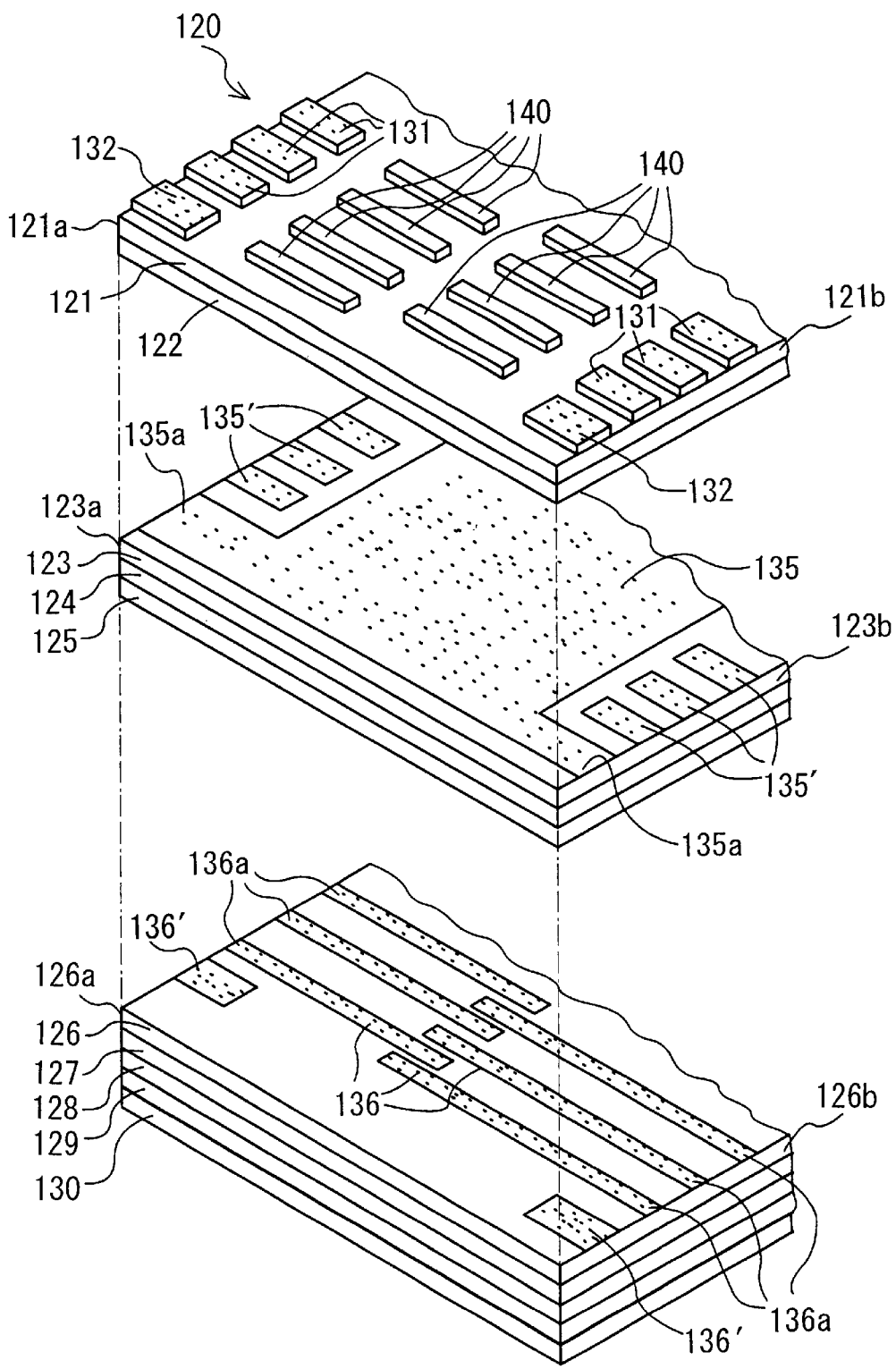
FIG. 13 is a disassembled perspective view of the plate-like piezoelectric actuator.
Figure 14:
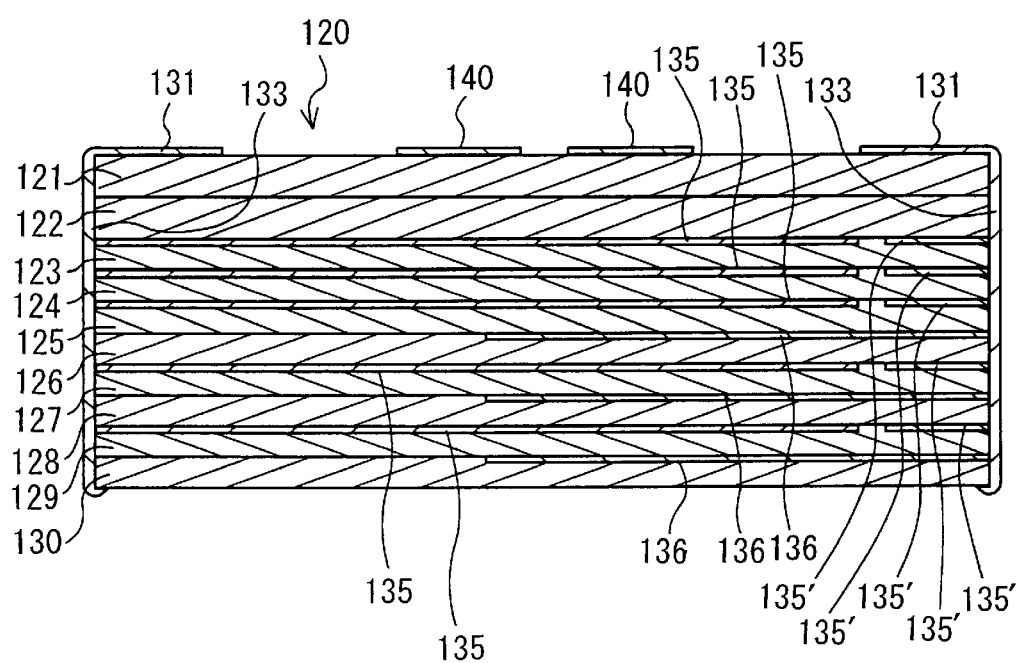
FIG. 14 is a sectional view of the plate-like piezoelectric actuator taken along line I—I in FIG. 12, looking in the direction of the appended arrows.

Referring to FIGS. 12 to 14, a structure of the ink jet head structured described above will be described.

As shown in FIGS. 12 to 14, the piezoelectric actuator 120 is constructed by stacking ten piezoelectric sheets 121, 122, 123, 124, 125, 126, 127, 128, 129, 130 in this order from above. The piezoelectric sheets 126, 128, 130 are identical in structure. On the upper surface of each piezoelectric sheet 126, 128, 130, the elongate driving electrodes 136 are formed on positions corresponding to the respective pressure chambers 116 formed in the cavity plate 110. As shown in FIG. 13, connectors 136a are formed at sides 126a, 126b of the piezoelectric sheet 126. Quasi pattern electrodes 136', which is a land pattern that does not contribute to deformation of the piezoelectric sheets, are formed on positions corresponding connectors 135a of the common electrodes 135, on the upper surface of the piezoelectric sheets 126, 128, 130.

As shown in FIGS. 13 and 14, the piezoelectric sheets 123, 124, 125, 127, 129 are identical in structure. On the upper surface of each piezoelectric sheet 123, 124, 125, 127, 129, is the band-shape common electrode 135, which is a common electrode for all of the pressure chambers 116. The connectors 135a of each common electrode 135 are formed at the sides 123a, 123b of the piezoelectric sheets 123, 124, 125, 127, 129. Quasi pattern electrodes 135', which is a land pattern that does not contribute to deformation of the piezoelectric sheets, are formed on positions corresponding to the connectors 136a of the driving electrodes 136, on the upper surface of the piezoelectric sheets 123, 124, 125, 127, 129. The thickness of the quasi pattern electrodes 135', 136' is the same as that of the driving electrodes 136 and the common electrodes 135, so that recessed portions in the piezoelectric sheets where the driving electrodes 136 and the common electrodes 135 do not exist will be flattened when the piezoelectric sheets are laminated.

As shown in FIG. 13, on the upper surface of the piezoelectric sheet 121, the surface electrodes 131 and 132, which correspond to the respective driving electrodes 136 and the common electrode 135, respectively, are provided along long sides 121a, 121b of the piezoelectric sheet 121. The surface electrodes 131 and 132 are provided with respect to the upper surface of the cavity plate 110 between the line of the pressure chambers 116 and slots 141 and 142. Between the surface electrodes 131 aligned along the side 121a of the piezoelectric sheet 121 and the surface electrodes 131 aligned along the side 121b of the piezoelectric sheet 121, the substantially rectangular pseudo electrodes 140 are provided with respect to lands 116e (see FIG. 12), which are provided to the cavity plate 110 to separate the adjacent pressure chambers 116. The thickness of the pseudo electrodes 140 is about the same as that of the surface electrodes 131.

The pseudo electrodes 140 are not connected with the common electrodes 135 nor the driving electrodes 136. When the piezoelectric actuator 120 is bonded to the cavity plate 110, the pseudo electrodes 140 contacts an assembly jig 160. While the piezoelectric sheet 122 is made of the same material as the piezoelectric sheet 121, no electrode is provided to the piezoelectric sheet 122.

As shown in FIG. 12, after the piezoelectric sheets 121 to 130 are stacked as described above, external electrodes 133 and 134 are formed on the right and left sides so as to be perpendicular to the upper and lower surfaces of the piezoelectric sheets 121 to 130. The external electrodes 133 electrically connect the driving electrodes 136 with the respective surface electrodes 131. The external electrodes 134 electrically connect the common electrodes 135 with the respective surface electrodes 132.

In the piezoelectric actuator 120 of the embodiment, the driving electrodes 136 are provided on the three piezoelectric sheets 126, 128, 130. However, the driving electrodes 136 may be provided on any number of sheets, for example, one, two or five of the piezoelectric sheets 121 to 130. In accordance with the number of piezoelectric sheets on which the driving electrodes 136 are provided, a corresponding number of piezoelectric sheets each of which has a common electrode 135 may be provided.

Next, a producing method of the piezoelectric sheets 121 to 130 will be described. The piezoelectric sheets 121 to 130 are produced by the following method. First, ceramic powder of ferroelectric lead zirconate titanate (PZT ($PbTiO_3 \cdot PbZrO_3$)) material, a binder and a solvent are mixed into a mixed liquid having a viscosity between 10,000 and 30,000 CPS. The mixed liquid is spread and dried on films of polyethylene terephthalate (PET) or other plastic material to form ten piezoelectric sheets. Each of the piezoelectric sheets has thickness of between 5–40 $\mu$m, preferably between 15–30 $\mu$m. In this exemplary embodiment, the thickness of each of the piezoelectric sheets is made between about 22.5–30 $\mu$m. Metallic material is screen-printed on portions of three of the piezoelectric sheets to make the driving electrodes 136 and the quasi pattern electrodes 136'. These three sheets will be the piezoelectric sheets 126, 128, 130.

As is the case with the first embodiment, the width of the driving electrodes is between 50–500 $\mu$m, preferably between 80–200 $\mu$m, and the thickness of them is between 0.7–5 $\mu$m, preferably between 1–3 $\mu$m.

Metallic material is screen-printed on portions of the other five of the piezoelectric sheets which portions will be the common electrodes 135 and the quasi pattern electrodes 135'. These five piezoelectric sheets will be the piezoelectric sheets 123, 124, 125, 127, 129. Likewise, metallic material is screen-printed on portions of another other one of the piezoelectric sheets to make the surface electrodes 131, 132 and the pseudo electrodes 140. This piezoelectric sheet will be the piezoelectric sheet 121. The last one of the piezoelectric sheets is not printed with any electrodes. This sheet will be the piezoelectric sheet 122.

The ten piezoelectric sheets 130, 129, 128, 127, 126, 125, 124, 123, 122, 121 are alternatively stacked, in this order, from below upward, with the piezoelectric sheet 130 positioned at the bottom. The stacked piezoelectric sheets 130 to 121 are pressed with heat, degreased and sintered to form a piezoelectric block. Then, the external electrodes 133, 134 are formed at the sides of the piezoelectric block. The laminated block thus constructed is then immersed in an oil bath (not shown) filled with a silicone oil or another insulating oil at a temperature of about 130° C. All of the surface electrodes 131 are connected to a positive voltage power supply and all of the surface electrodes 132 are connected to the ground. An electric field of about 2.5 kv/mm is applied between surface electrodes 131 and 132 to polarize the portions between the driving electrodes 136 and the common electrodes 135 of the piezoelectric sheets 125 to 129. Thus, the plate-like piezoelectric actuator 120 is obtained.

The surface electrodes 132 are connected to the ground and the driving voltage is applied to either one of the surface electrodes 131. An electric field is generated in parallel to the polarized direction at the piezoelectric sheets 125 to 129 between the common electrodes 135 and the driving electrodes 136 which are connected to the surface electrode 131 to which the driving voltage is applied. The piezoelectric sheets 125 to 129 expand to apply pressure to ink in the pressure chambers 116 of the cavity plate 110. Thus the piezoelectric sheets 125 to 129 between the common electrodes 135 and the driving electrodes 136 act as the active layers. There is a difference in shrinking percentage between the piezoelectric ceramic and the metallic material constituting the electrodes when the piezoelectric sheets 121 to 130 are sintered. Therefore, the piezoelectric sheets 121 to 124 function as a restraining layer in order to prevent warps and/or waves to keep the flatness in the piezoelectric sheets 121 to 130 of the active layer after sintering of the piezoelectric sheets 121 to 124 and in order to make the active layer of the piezoelectric sheets 125 to 129 deform only toward the pressure chambers 116.

The cavity plate 110 will be described with reference to FIGS. 15 and 16.

Figure 15:
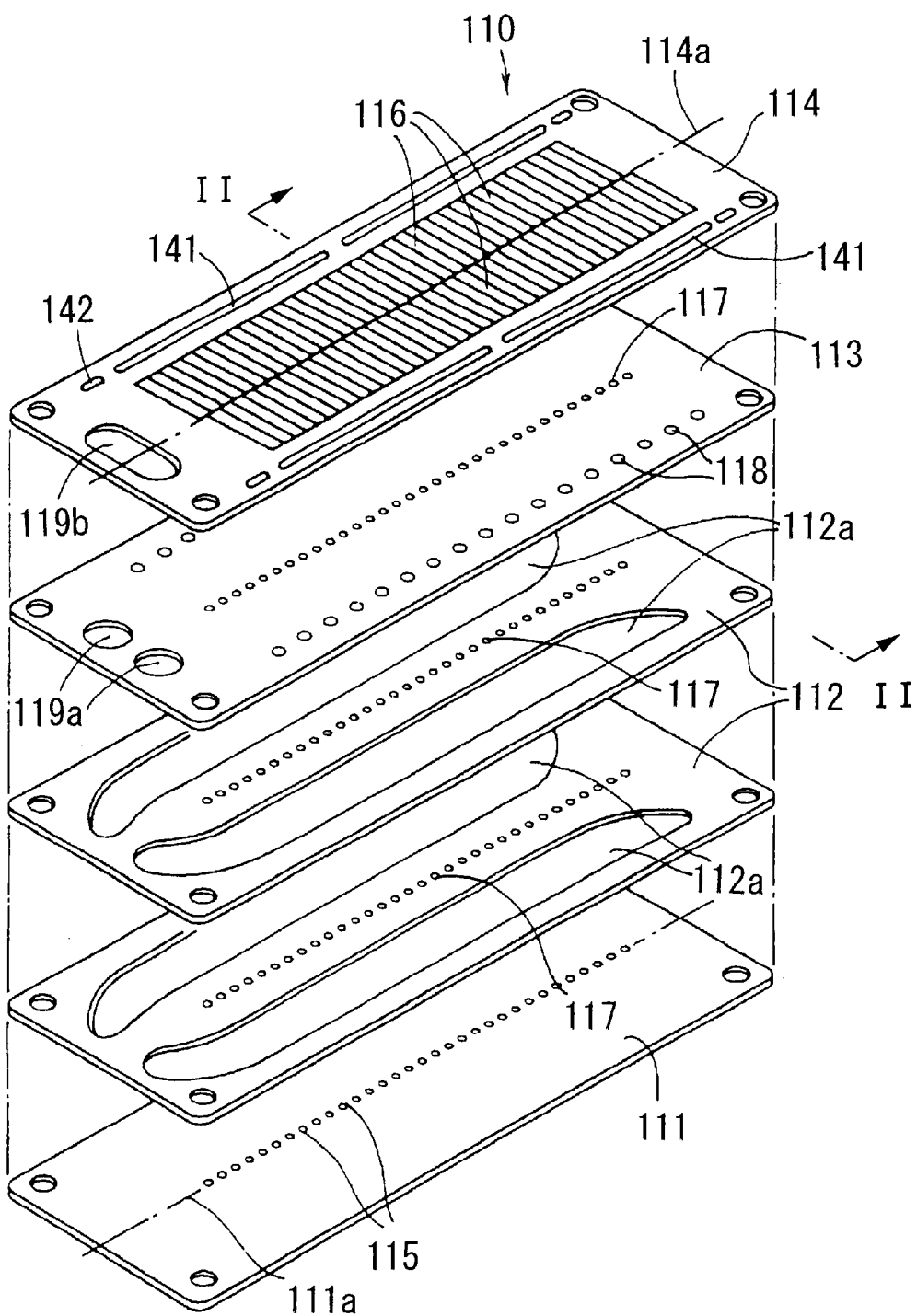
FIG. 15 is a disassembled perspective view of the cavity plate.
Figure 16:
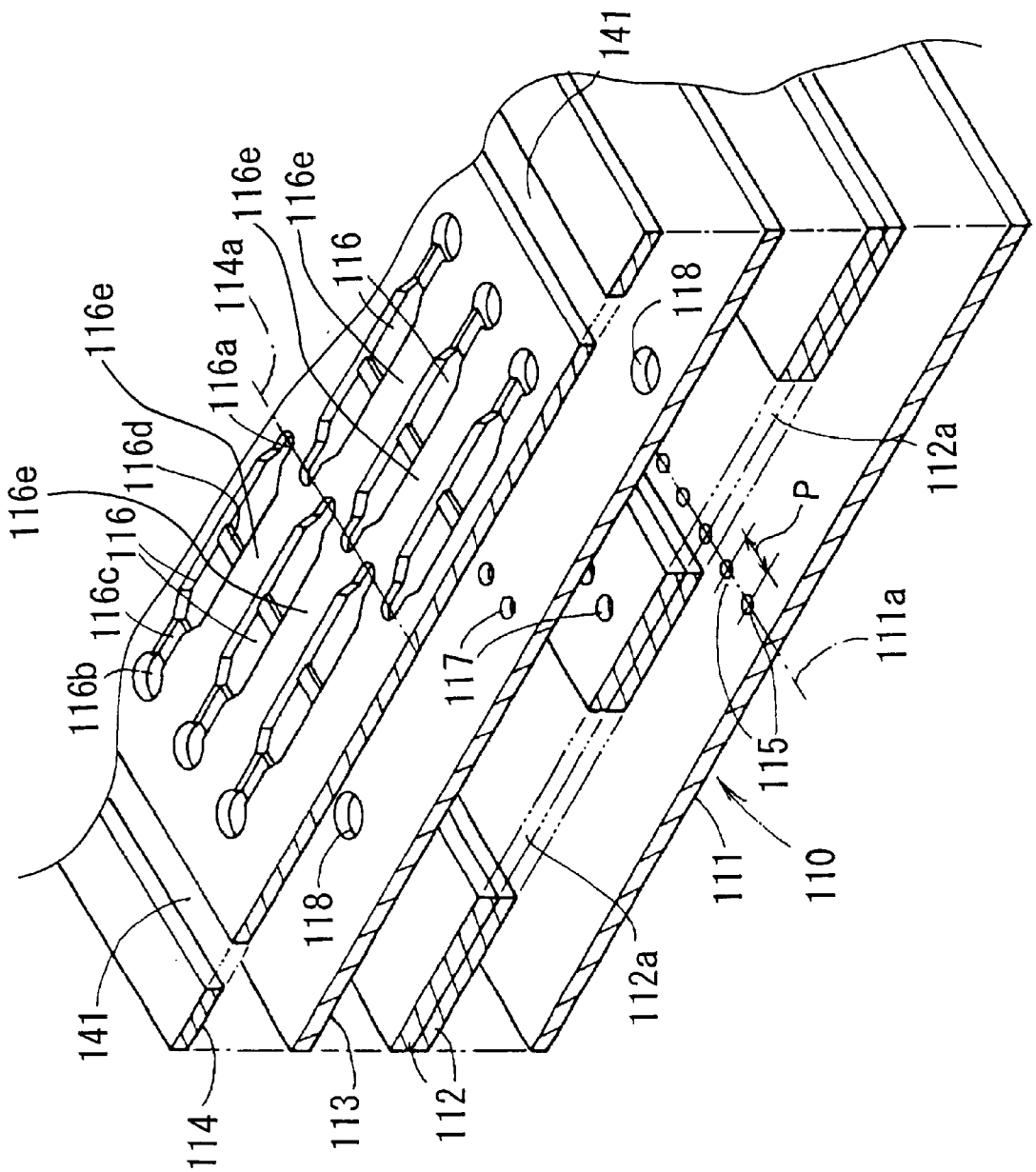
FIG. 16 a disassembled sectional view of the cavity plate taken along line II—II in FIG. 15, looking in the direction of the appended arrows.

As shown in FIGS. 15 and 16, the cavity plate 110 has five metal plates, namely, a nozzle plate 111, two manifold plates 112, 112, a spacer plate 113, and a base plate 114. These five plates are stacked in this order from below upward.

As shown in FIGS. 15 and 16, in the nozzle plate 111, a plurality of nozzles 115 having an extremely small diameter, are provided with a small pitch P, along a center line 111a parallel to the longitudinal direction of the nozzle plate 115. In the two manifold plates 112, 112, a plurality of through holes 117 are provided to be aligned with the nozzles 115, and ink passage 112a are provided along both sides of the row of the through holes 117. The ink passages 112a, 112a are closed by the spacer plate 113 contiguous to the upper manifold plate 112.

In the base plate 114, a plurality of narrow pressure chambers 116 are provided so as to laterally extend to the center line 114a and the row of the pressure chambers 116 are arranged parallel to the longitudinal direction. Each pressure chamber 116 includes an ink outlet 116a and an ink inlet 116b. The ink outlet 116a is positioned on the center line 114a. The pressure chambers 116 alternatively extends in the opposite directions with their ink outlets 116a aligned on the center line 114a. The ink inlets 116a communicate with the nozzles 115 in the base plate 111, via the through holes 117 having the extremely small diameter and formed in the spacer plate 113 and the manifold plates 112, 112. The ink inlets 116b of the pressure chambers 116 communicate with the ink passages 112a in the manifold plates 112, via through holes 118 formed in the spacer plate 113.

Ink flows into the ink passages 112a from ink supply holes 119a, 119b formed in one end portion of the spacer plate 113 and the base plate 114, and then is distributed to the pressure chambers 116 via the through holes 118. After that, the ink is supplied to the respective nozzles 115 corresponding to the pressure chambers 116 via the through holes 117.

Each pressure chamber 116 is provided with an orifice 116c at a position adjacent to the ink inlet 116b. The orifice 116c is a shallow recess and regulates an amount of ink flow. Each pressure chamber 116 is strengthened by a beam 116d, which is integrally provided at a substantially middle of each pressure chamber 116. As shown in FIG. 16, between the pressure chambers 116 in the base plate 114, a land 116e is provided to separate the adjacent pressure chambers 116.

The piezoelectric actuator 120 constructed as described above is bonded to the cavity plate 110 so that the lower surface of the piezoelectric plate 130 of the piezoelectric actuator 120 closes the pressure chambers 116 of the cavity plate 110. On the upper surface of the piezoelectric plate 121 of the piezoelectric actuator 120, the flexible flat cable 150 is stacked and pressed, thereby wiring patterns (not shown) in the flexible flat cable 150 are electrically connected with the surface electrodes 131, 132. Slots 141 and 142 are provided on the top surface of the base plate 114 with respect to the bottom ends of the external electrodes 133 and 134 so that the external electrodes 133 and 134 do not electrically contact with the base plate 114.

Next, a process of adhering the piezoelectric actuator 120 to the cavity plate 110 will be described with reference to FIGS. 17 to 20.

Figure 17:
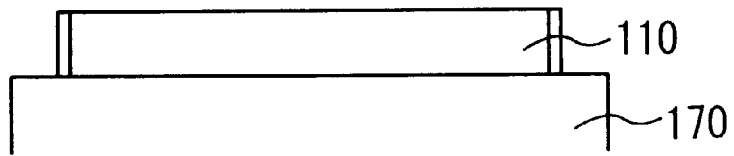
FIG. 17 is a diagram showing a process of adhering the plate-like piezoelectric actuator to the cavity plate.
Figure 18:
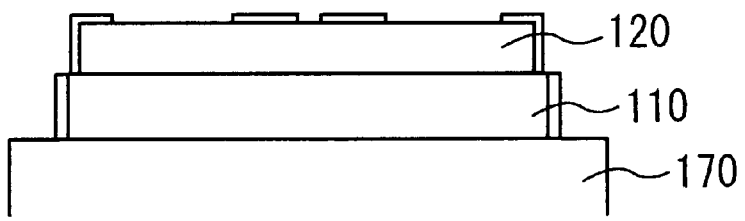
FIG. 18 is a diagram showing the process of adhering the plate-like piezoelectric actuator to the cavity plate.
Figure 19:
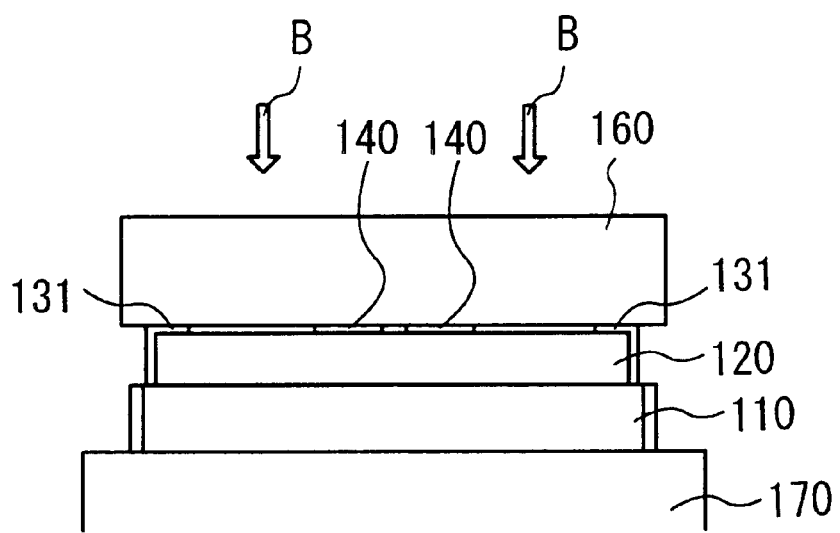
FIG. 19 is a diagram showing the process of adhering the plate-like piezoelectric actuator to the cavity plate.

First, as shown in FIG. 17, the cavity plate 110 is placed on a workbench 170 having a flat surface. Next, as shown in FIG. 18, the piezoelectric actuator 120, to which an adhesive is applied at its bottom, is placed on the cavity plate 110 on the workbench 170, while checking to make sure that the cavity plate 110 is in proper alignment with the piezoelectric actuator 120. Then, as shown in FIG. 19, a force of 10 kg-weight is applied to the upper surface of the piezoelectric actuator 120, in a direction indicated with an arrow B, using an assembly jig 160 having a flat bottom surface. Thus, the piezoelectric actuator 120 is bonded to the cavity plate 110.

The surface electrodes 131, 132 provided on the piezoelectric actuator 120 correspond to the outer side portions of the line of the pressure chambers 116 of the upper surface of the cavity plate 110 and the pseudo electrodes 140 correspond to the lands 116e between the pressure chambers 116. At that time, the pressing force from the assembly jig 160 is applied so as to press the piezoelectric actuator 120 to the upper surface of the cavity plate 110. Therefore, even if there are waves in the piezoelectric actuator 120, the waves can be flattened by the force transmitted from the assembly jig 160 via the pseudo electrodes 140 formed in the middle of the piezoelectric actuator 120. Accordingly, the piezoelectric actuator 120 can be surely bonded to the cavity plate 110 without clearances or voids.

Figure 20:
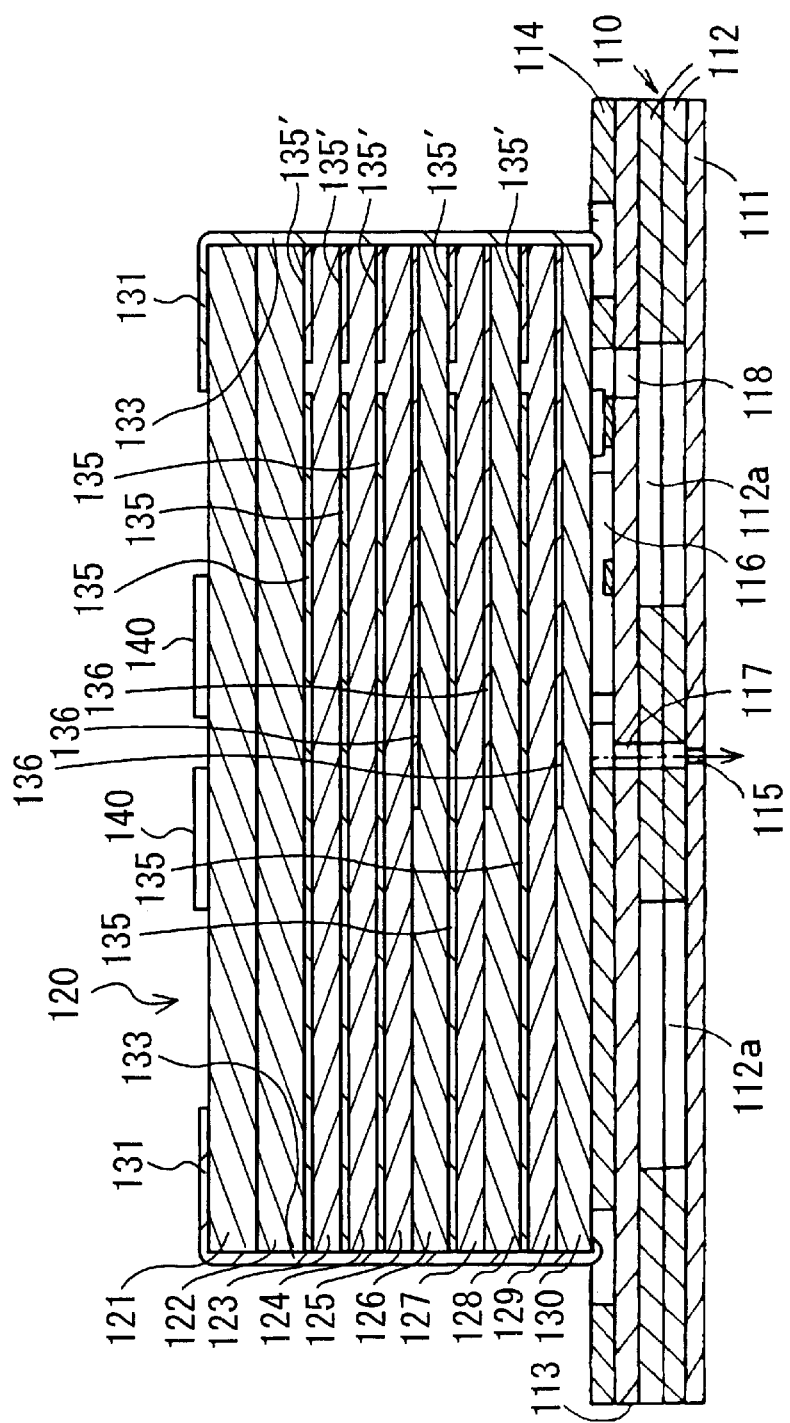
FIG. 20 is a sectional view showing a state where the plate-like piezoelectric actuator is adhered to the cavity plate.
Figure 21:
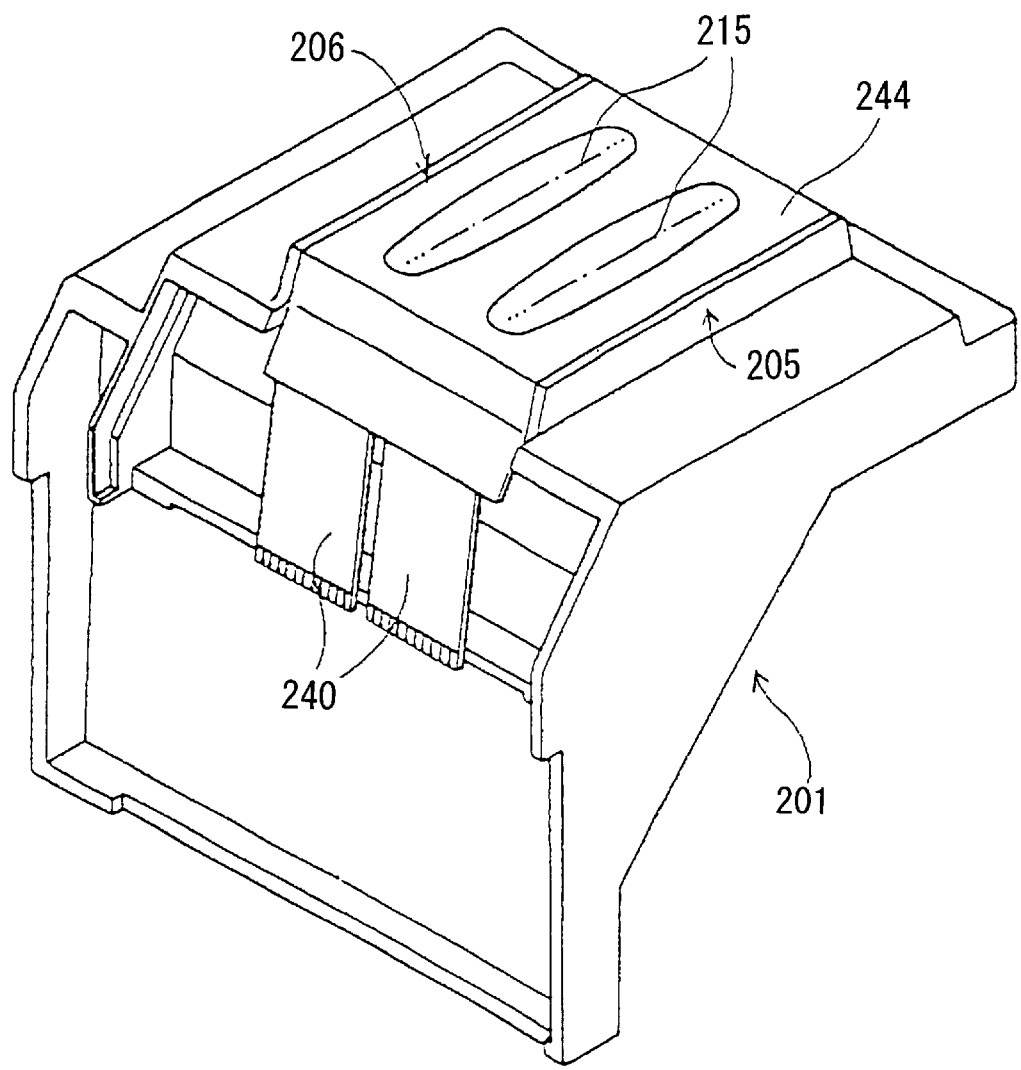
FIG. 21 is a perspective view of a piezoelectric ink jet head of a third embodiment of the invention, with its nozzles facing upward.

As shown in FIG. 20, with the adhesion method described above, the piezoelectric actuator 120 can be surely bonded to the cavity plate 110 without clearances or voids. Accordingly, the piezoelectric actuator 120 is intimately bonded to the cavity plate 110, so that the adhesion of the piezoelectric actuator 120 and the cavity plate 110 is improved and the ink leakage from the pressure chambers 116 can be minimized or prevented. Thus, the development of defects in the ink jet print heads 101 can also be minimized or prevented.

The shape of the pseudo electrode 140 is not restricted to the strip shape. For example, the pseudo electrode 140 can have a wide band-shape projection like the common electrode 135. While the surface electrodes 131 and 132 are connected to the driving electrodes 136 and the common electrodes 135, respectively, by externally providing the electrodes 133 and 134, they may be connected to each other by providing electrodes in through holes formed in piezoelectric sheets. The pressure chambers 116 can be arranged in more than three lines by providing the driving electrodes 136 in the respective multiple lines.

Another exemplary embodiment of the invention will be described with reference to FIGS. 21 to 31B.

Figure 23:
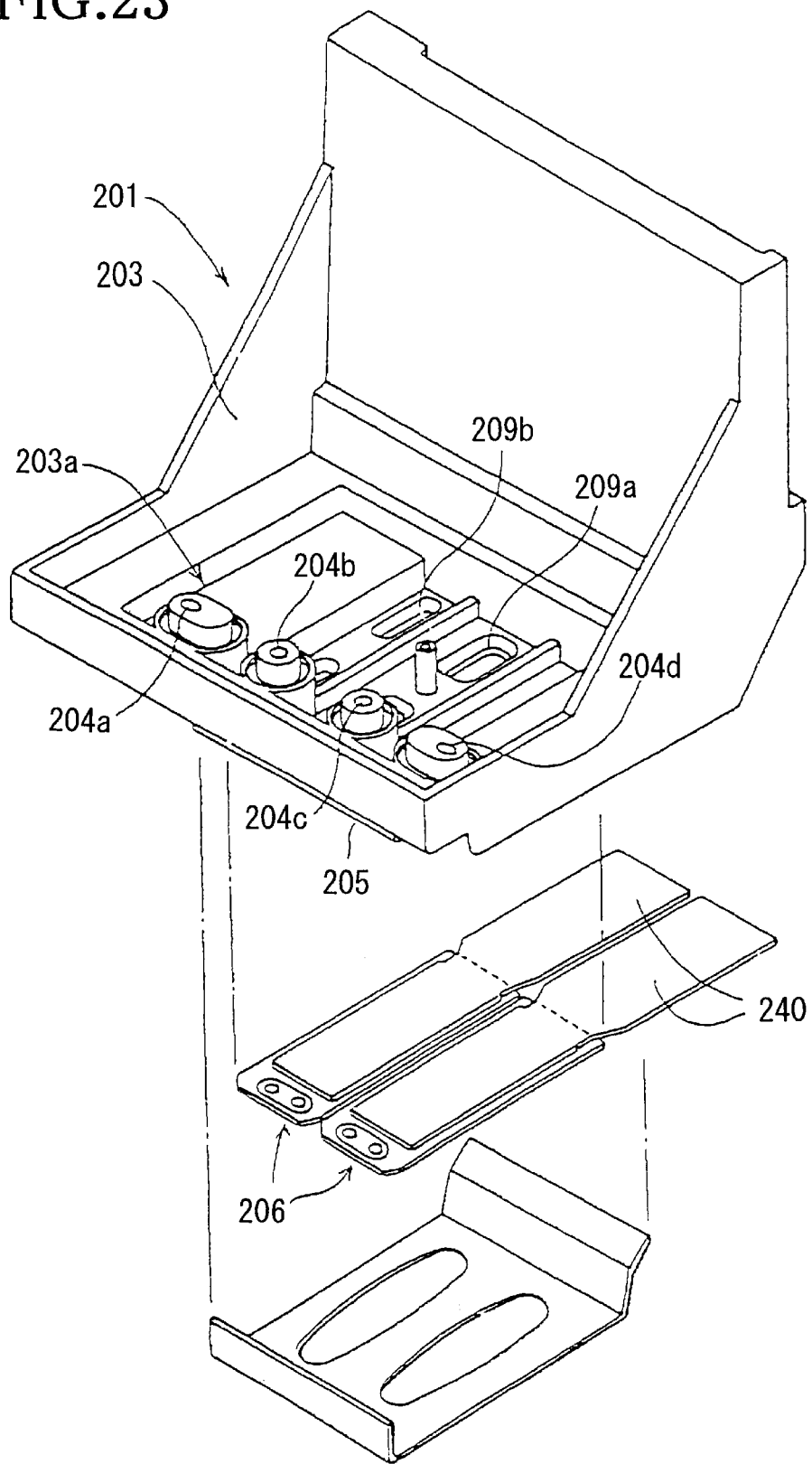
FIG. 23 is a disassembled perspective view of the piezoelectric ink jet head of FIG. 21, looking down from a frame.

As shown in FIG. 23, a frame 201 to be mounted on a carriage is formed into substantially a box with its upper surface open. A mount 203 is formed in the frame 201, and four ink cartridges (not shown) for supplying ink are detachably mounted to the mount 203 from above the frame 201. On one side 203a of the mount 203, ink supply passages 204a, 204b, 204c, 204d connected to ink discharge ports (not shown) are formed so as to pass through a bottom plate 205 of the frame 201. A rubber packing (not shown) is disposed on the upper surface of the one side 203a of the mount 203 so as to intimately contact the ink discharge ports (not shown) of the ink cartridges.

Figure 22:
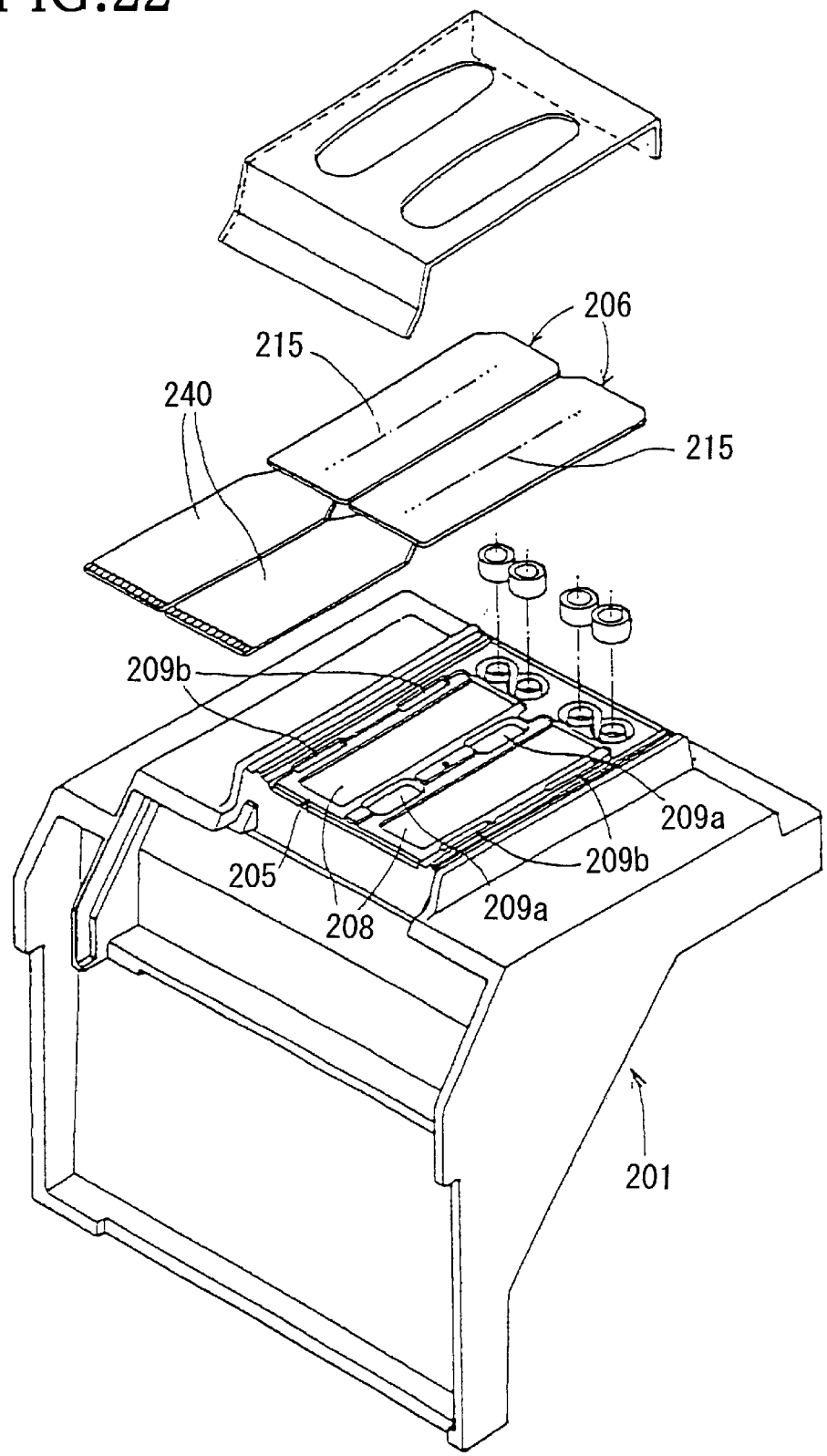
FIG. 22 is a disassembled perspective view of the piezoelectric ink jet head of FIG. 21.
Figure 24:
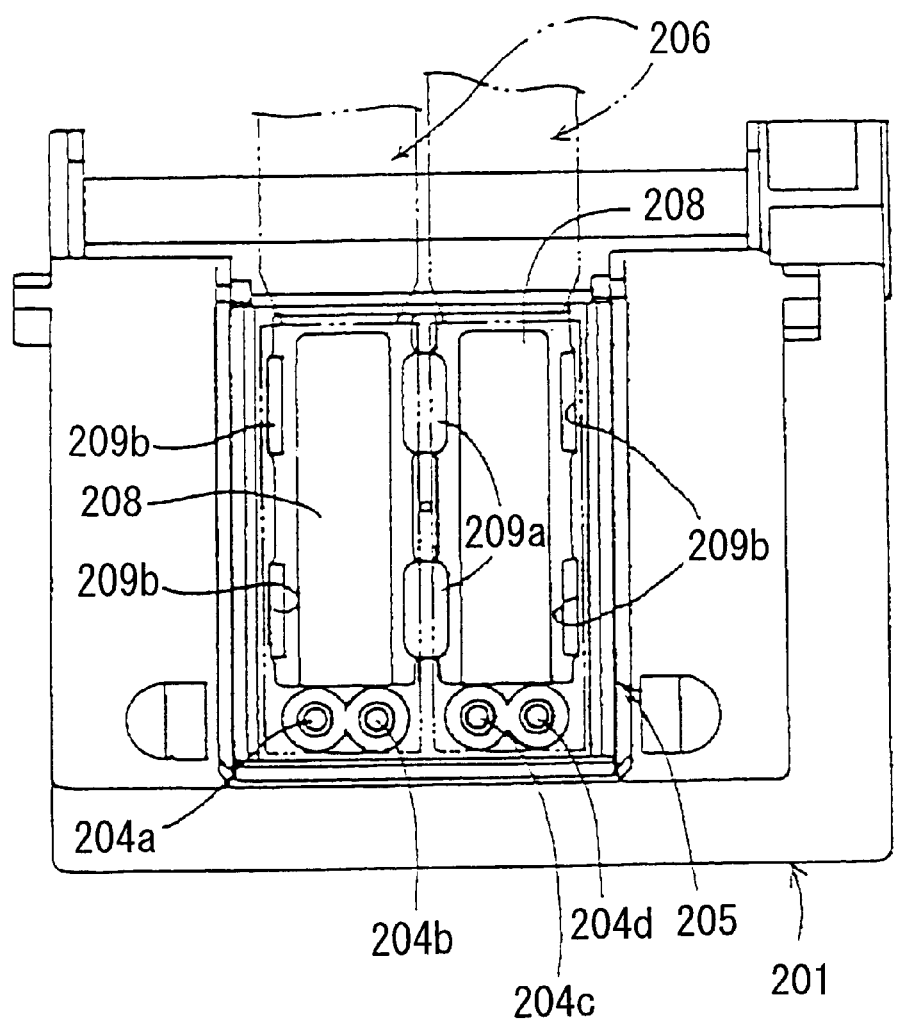
FIG. 24 is a bottom view of a bottom plate of the frame of the piezoelectric ink jet head of FIG. 21.

The bottom plate 205 is stepped down from the mount 203 so as to horizontally project there from. As shown in FIGS. 22 and 24, on the underside of the bottom plate 205, two stepped supports 208, 208 are formed to receive two front head units 206, side by side, as described later. In the bottom plate 205, a plurality of recesses 209a, 209b, which are filled with an UV adhesive to bond the front head units 206, are formed so as to penetrate the bottom plate 205.

Figure 25:
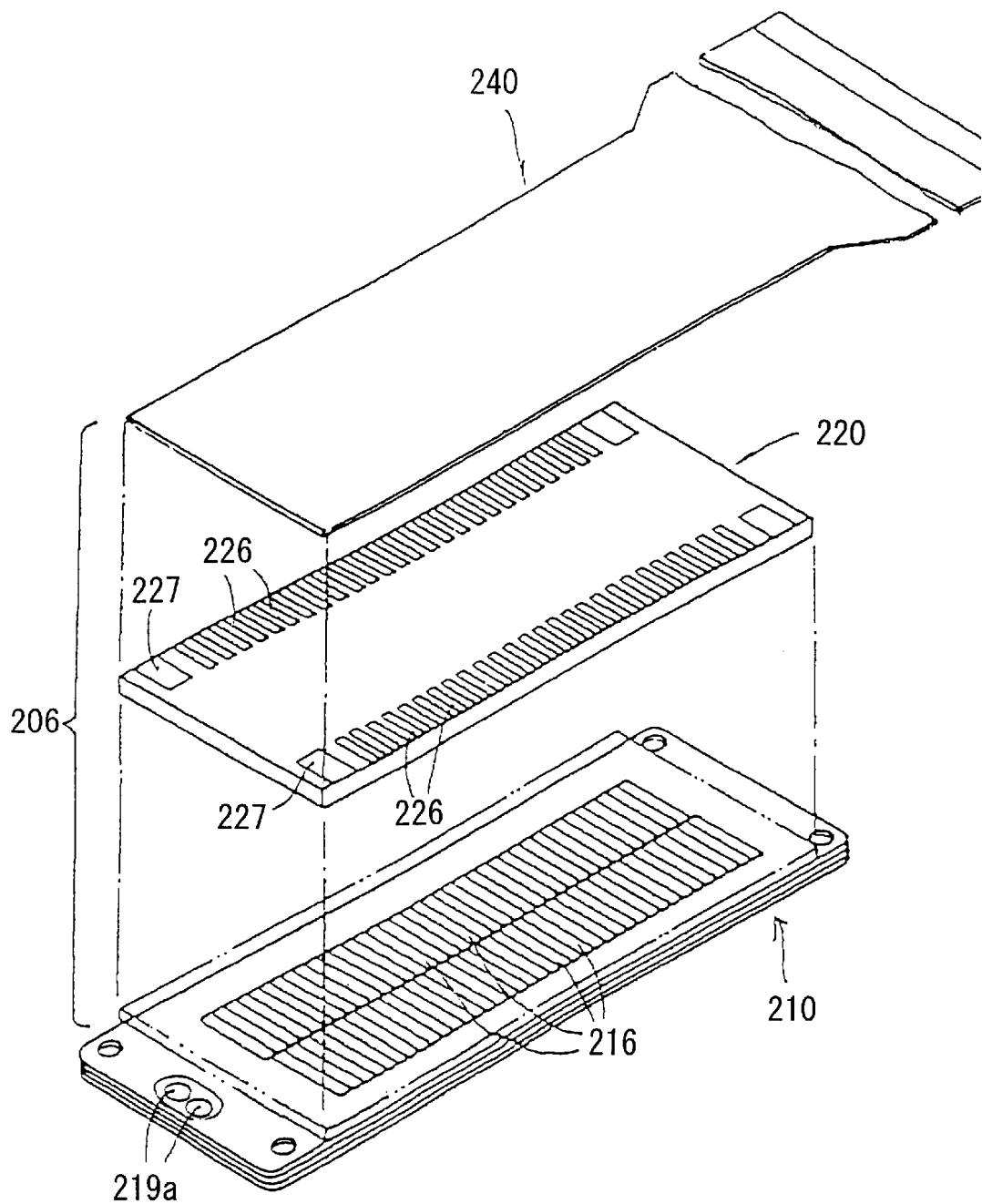
FIG. 25 is a perspective view of a front head unit in the piezoelectric ink jet head of FIG. 21.
Figure 26:
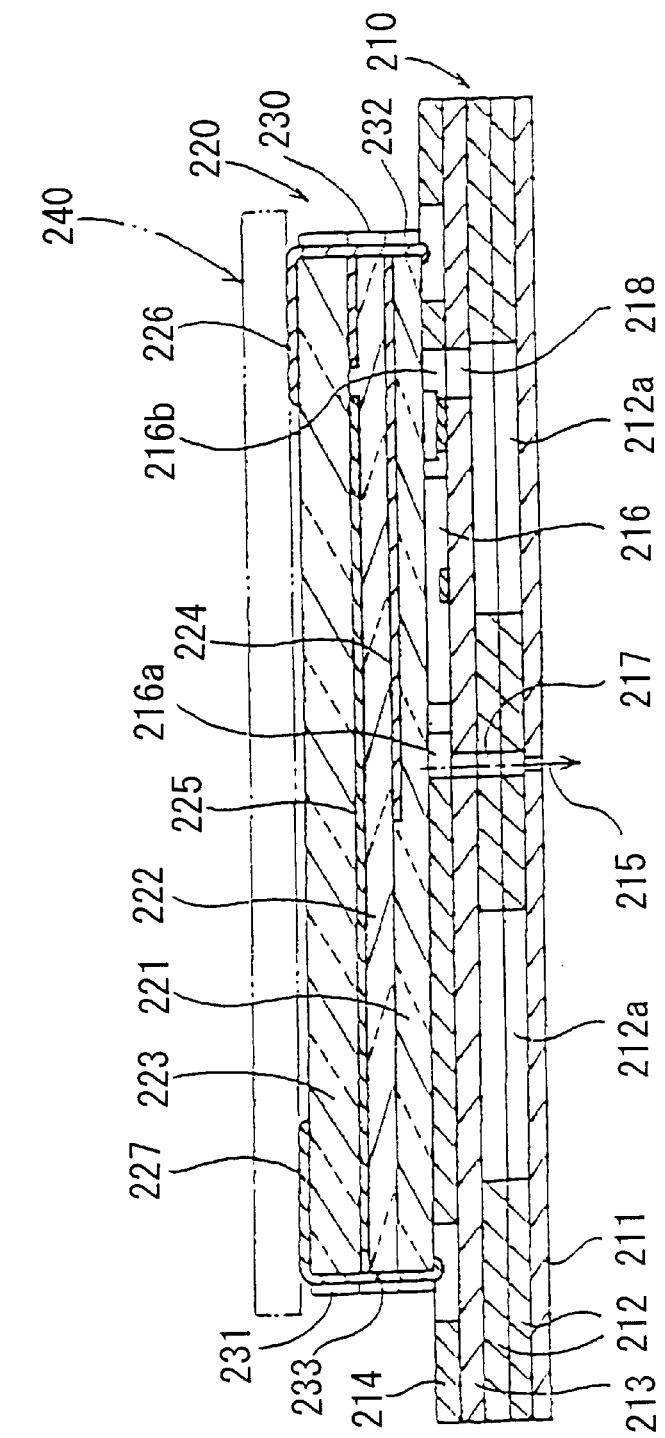
FIG. 26 is a sectional view of the front head unit in the piezoelectric ink jet head of FIG. 21.

As shown in FIGS. 25 and 26, the front head unit 206 is constructed from a cavity plate 210 constructed by laminating a plurality of thin metal plates, a plate-like piezoelectric actuator 220 laminated to the cavity plate 210 using an adhesive or an adhesive sheet, and a flexible flat cable 240 bonded, using an adhesive, to the upper surface of the piezoelectric actuator 220 for electric connection with external equipment. Nozzles 215 are formed on the underside of the cavity plate 210 at the bottom and ink is ejected downward there from.

Figure 28:
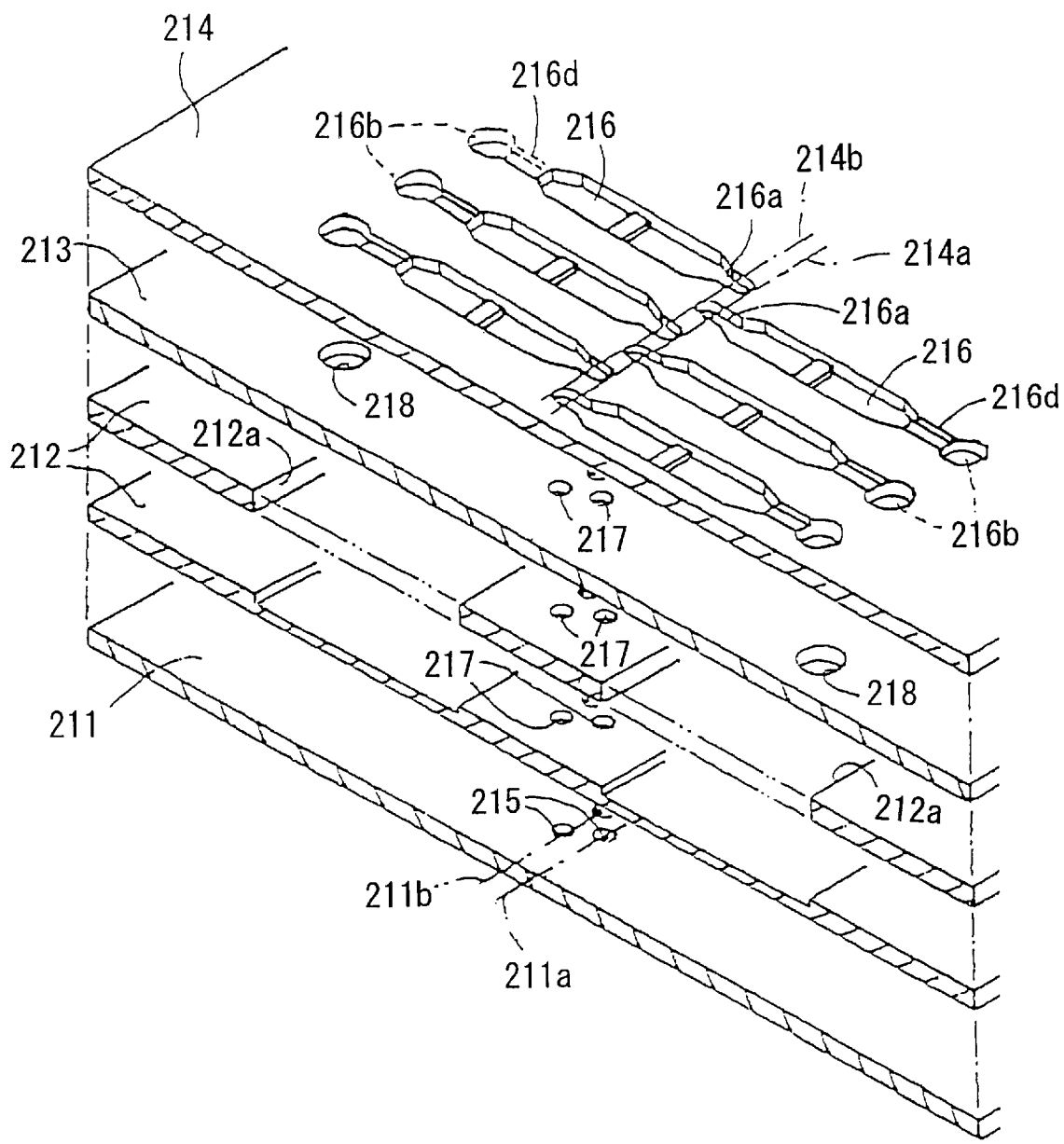
FIG. 28 is a disassembled enlarged perspective view of the cavity plate in the piezoelectric ink jet head of FIG. 21.

The cavity plate 210 is constructed as shown in FIG. 28. Five thin metal plates, namely, a nozzle plate 211, two manifold plates 212, a spacer plate 213, and a base plate 214, are laminated in this order using an adhesive. In this embodiment, each of plates 211 to 214 is a steel plate alloyed with 42% nickel, about 50–150 $\mu$m thick. These plates 211 to 214 may be formed of for example, resins, instead of metals.

In the nozzle plate 211, a plurality of nozzles 215 having an extremely small diameter (the order of 25 $\mu$m in diameter in this embodiment) are provided with a small pitch P, in a staggered configuration, along center lines 211a, 211b extending in a longitudinal direction of the nozzle plate 211.

The manifold plates 212, 212 are sandwiched between the nozzle plate 211 and the spacer plate 213 so as to be closed by them.

As shown in FIG. 28, in the base plate 214, a plurality of narrow pressure chambers 216 are provided, in a staggered configuration, so as to extend in a direction perpendicular to the center lines 214a, 214b in the longitudinal direction. Each pressure chamber 216 has an ink outlet 216a, an ink inlet 216b and an orifice 216d. The ink inlets 216b communicate with common pressure chambers 212a in the manifold plates 212, via the ink supply holes 218 provided on right and left side portions of the spacer plate 213. A cross-sectional area of the orifice 216d perpendicular to an ink flow direction is smaller than that of the pressure chamber 216. By doing so, the resistance to the flow of ink can be increased.

The ink outlet 216a of each pressure chamber 216 is positioned so as to be aligned with an associated one of the nozzles 215 in the nozzle plate 211. The ink inlets 216a communicate with the spacer plate 213 and the manifold plates 212, 212, via the through holes 217 having an extremely small diameter and are formed in the staggered configuration similarly to the nozzles 215.

Figure 29:
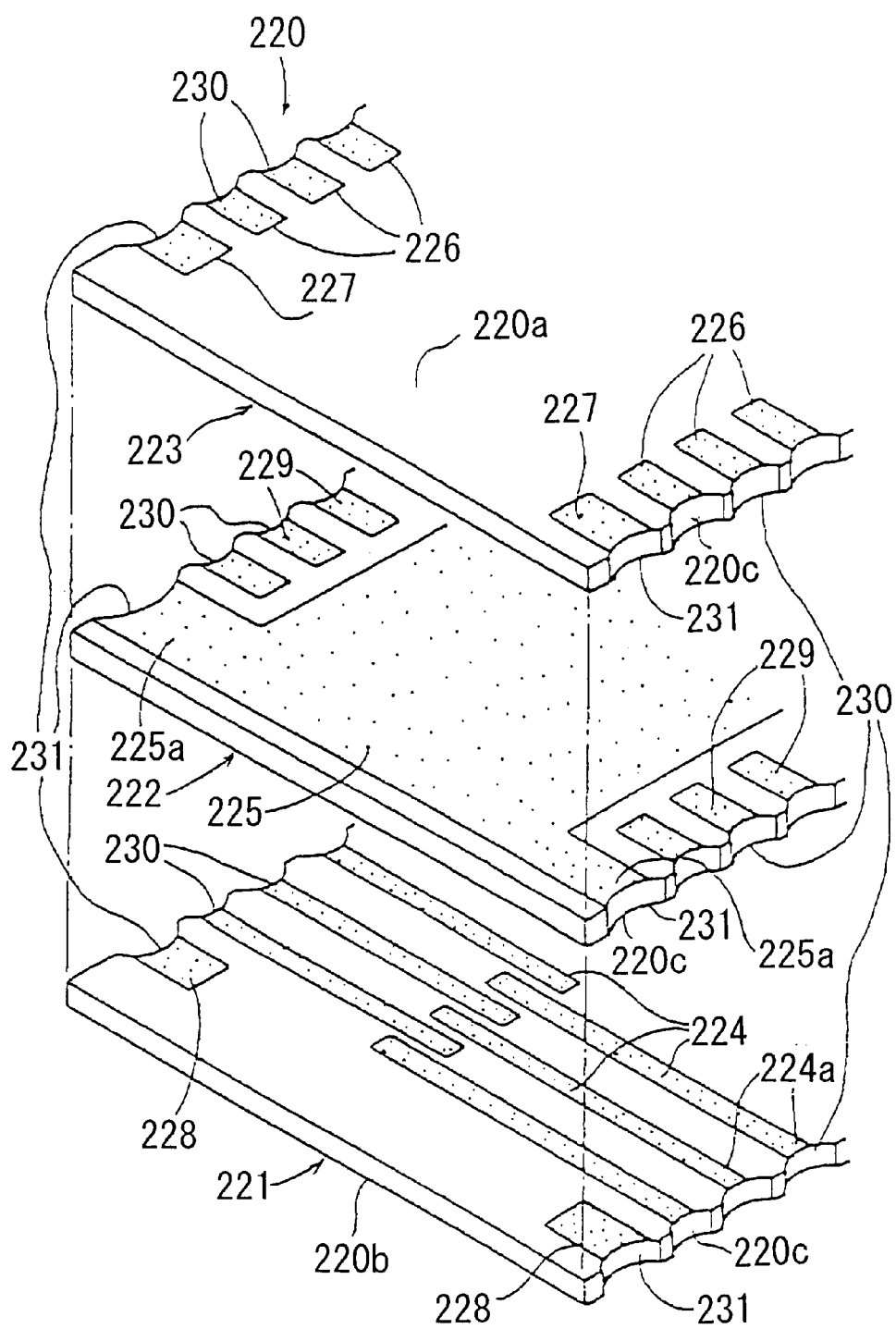
FIG. 29 is a disassembled enlarged perspective view of a piezoelectric actuator in the piezoelectric ink jet head of FIG. 21.

As shown in FIG. 29, the piezoelectric actuator 220 is constructed by laminating three piezoelectric sheets 221, 222, 223. On the upper surface of the lowermost piezoelectric sheet 221, a plurality of narrow driving electrodes 224 are provided in a staggered configuration so as to be aligned with the respective pressure chambers 216 in the cavity plate 210. A connector 224a of each driving electrode 224 is provided at a side 220c perpendicular to an upper side 220a and an underside 220b of the piezoelectric actuator 220.

On the upper surface of the piezoelectric sheet 222, a common electrode 225 is formed so as to be aligned with the pressure chambers 216. As is the case with the driving electrodes 224, connectors 225a of the common electrode 225 are provided at the right and left sides 220c.

On the upper surface of the topmost piezoelectric sheet 223, surface electrodes 226 aligned with the respective driving electrodes 224 and surface electrodes 227 aligned with the common electrode 225 are provided along the right and left sides 220c.

As is the case with the first embodiment, the width of the driving electrodes is between 50–500 $\mu$m, preferably between 80–200 $\mu$m, and the thickness of them is between 0.7–5 $\mu$m, preferably between 1–3 $\mu$m.

At the right and left sides 220c, first and second grooves 230, 231 are formed in the laminating direction. The first grooves 230 are provided to the portions where the connectors 224a of the driving electrodes 224, the surface electrodes 226 and quasi pattern electrodes 229 exist. The second grooves 231 are provided to the portions where the connectors 225a of the common electrodes 225, the surface electrodes 227 and quasi pattern electrodes 228 exist. As shown in FIG. 26, an external electrode 232 is provided in each first groove 230 to electrically connect the driving electrodes 224 with the respective surface electrodes 226. An external electrode 233 is provided in each second groove 231 electrically connect the common electrode 225 with the surface electrodes 227.

Each area in the piezoelectric sheet 222 sandwiched between the common electrode 225 and the driving electrodes 224 is polarized to be provided with the piezoelectric characteristics. As a result, these areas become piezoelectrically active portions corresponding to the respective pressure chambers 216.

The cavity plate 210 and the piezoelectric actuator 220 constructed as described above are laminated each other so that the pressure chambers 216 of the cavity plate 210 are aligned with the respective driving electrodes 224 of the piezoelectric actuator 220. The flexible flat cable 240 is provided and pressed over the upper surface 220a of the piezoelectric actuator 220. As a result, a wiring pattern (not shown) of the flexible flat cable 240 is electrically connected with the surface electrodes 226, 227.

In such a construction, voltage is applied between the arbitrary driving electrodes 224 and the common electrode 225 of the piezoelectric actuator 220, generating electric fields in the driving electrodes 224 applied with the voltage, that is, in the piezo-electrically active portions of the piezoelectric sheets 222. Consequently, the electrostrictive effects of the piezoelectric sheets develop deformation in the piezoelectrically active portions in the laminating direction. The internal volume of the pressure chambers 216 corresponding to the driving electrodes 224 are reduced by the pressure produced due to the deformation. As a result, ink in the pressure chambers 216 is ejected from the nozzles 215, and thus printing is performed.

A fabricating method of the piezoelectric actuator 220 will be described. First, ceramic powder of ferroelectric lead zirconate titanate (PZT (PbTiO$_3$·PbZrO$_3$)) material, a binder and a solvent are mixed into a mixed liquid.

Next, the mixed liquid is applied on plastic films to be a predetermined thickness, using the doctor blade method, to form three piezoelectric sheets 221, 222, 223.

Each of the piezoelectric sheets has a thickness of between 5–40 $\mu$m, preferably between 15–30 $\mu$m.

Metallic material is screen-printed on those portions of the piezoelectric sheets 221, 222, 223 which will be electrodes, such as the driving electrodes 224.

Then, the piezoelectric sheets 221, 222, 223 formed as described above are stacked and pressed with heat to form a laminated block.

Next, the binder in the laminated block is burned by applying heat at a predetermined temperature. After that, the laminated block is sintered in a calcining furnace at a predetermined temperature.

Then, the laminated block is cut into smaller blocks having a predetermined size, thereby obtaining several piezoelectric actuators 220.

Then, the external electrodes 232, 233 are printed on the individual piezoelectric actuators 220 in the calcining furnace.

Next, a high voltage is applied between the electrodes 224 and 225 to polarize the piezoelectric sheet 221.

As described above, the piezoelectric actuators 220 to be used in the piezoelectric ink jet head of the embodiment are fabricated.

According to the fabricating method described above, the piezoelectric actuator 220, having extremely narrow electrodes of a width of 250 $\mu$m or smaller, or a width of 200 $\mu$m, can be obtained.

In particular, in this embodiment, the surfaces of the piezoelectric actuator 220 and the cavity plate 210 to be adhered to each other have a flatness such that the difference in height of asperities on the surfaces are 30 $\mu$m or less in an area of 5 mm$^2$.

Therefore, when the piezoelectric actuator 220 of this embodiment is bonded to the cavity plate 210, grinding of the surfaces, which is conventionally performed, can be omitted. In addition, the piezoelectric actuator 220, with the as-is state of a sintered body, can be bonded to the cavity plate 210 with no further process. Accordingly, the operating efficiency in the process of fabricating the piezoelectric actuator 220 can be improved and the fabricating cost can be reduced.

In this embodiment, the flatness of the surface of the plastic film forming the piezoelectric sheets, the pressing surface of the heat-pressing device, and the surface of the workbench on which the laminated block is to be placed when the binder eliminating process and the sintering process are implemented, have the flatness such that the difference in height of asperities on the surfaces is 30 $\mu$m or less in the area of 5 mm$^2$. Specifically, foreign substances are removed from these surfaces before materials are placed thereon.

As a result of removing foreign substances at each process, the laminated block is sintered with no foreign substances, so that asperities are hardly developed on the laminated block.

In particular, the height of projections formed on the surfaces to be bonded is 10 $\mu$m or less and the depth of the depressions is 20 $\mu$m or less. Therefore, the difference of the height between the projections and the depressions is 30 $\mu$m in the area of 5 mm$^2$.

Referring to FIGS. 30A, 30B, 31A and 31B, profiled data of the surface of the piezoelectric actuators 220 before external electrodes are printed thereon, will be described. These piezoelectric actuators 220 are obtained by cutting the laminated block sintered according to the process described above.

FIG. 30A is a three-dimensional view showing a surface of one sample of the piezoelectric actuator 220, wherein the surface is divided into 208 (8×26) sections. The piezoelectric actuator 220 is divided into 8 sections in a lateral direction and 26 sections in a longitudinal direction. The pressure chambers 216 and the nozzles 215 are aligned along the longitudinal direction.

Figure 27:
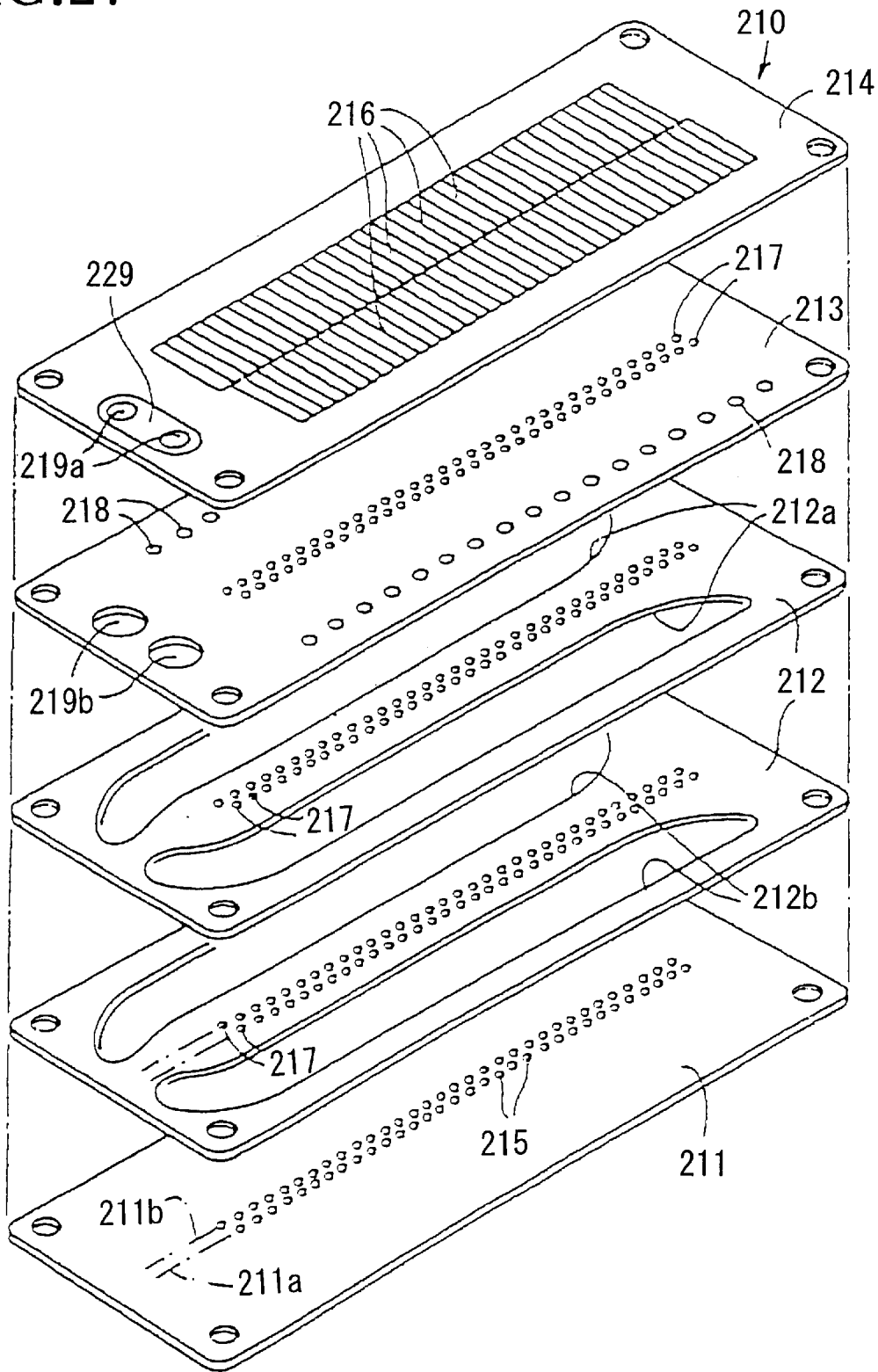
FIG. 27 is a disassembled perspective view of a cavity plate in the piezoelectric ink jet head of FIG. 21.

In the cavity plate 210, 75 sets of the pressure chambers 216 and the nozzles 215 are arrayed in a row and another 75 sets of pressure chambers 216 and the nozzles 215, which are bilaterally symmetrical with those shown in FIG. 27, are arrayed in a row. A total of 150 sets of pressure chambers 216 and nozzles 215 are therefore arrayed in two rows such that 150 nozzles are aligned in a row.

A number is serially assigned to the 75 sets of the pressure chambers 216 and the nozzles 215 aligned in the two rows as described above. Even numbers are assigned to one row of the 75 sets of the pressure chambers 216 and the nozzles 215, and odd numbers are assigned to another row of the 75 sets of the pressure chambers 216 and the nozzles 215. FIG. 30A is a three-dimensional surface profiling data viewed from a #1 side and the even number row side (EVEN side). A hypothetical plane is calculated based on the heights of the corners of the piezoelectric actuator 220. Then heights of each section from the hypothetical plane is calculated. In FIG. 30A, the areas A, B, C show that the height is between 0.02–0.03 mm, 0.01–0.02 mm, and 0–0.01 mm, respectively.

FIG. 30B corresponds to a diagram rotated 180 degrees from that shown in FIG. 30A and shows a three-dimensional surface profiling data viewed from a #150 side and the odd number row side (ODD side). The areas A, B, C show that the height is between 0.02–0.03 mm, 0.01–0.02 mm, and 0–0.01 mm, respectively.

Figure 31A:
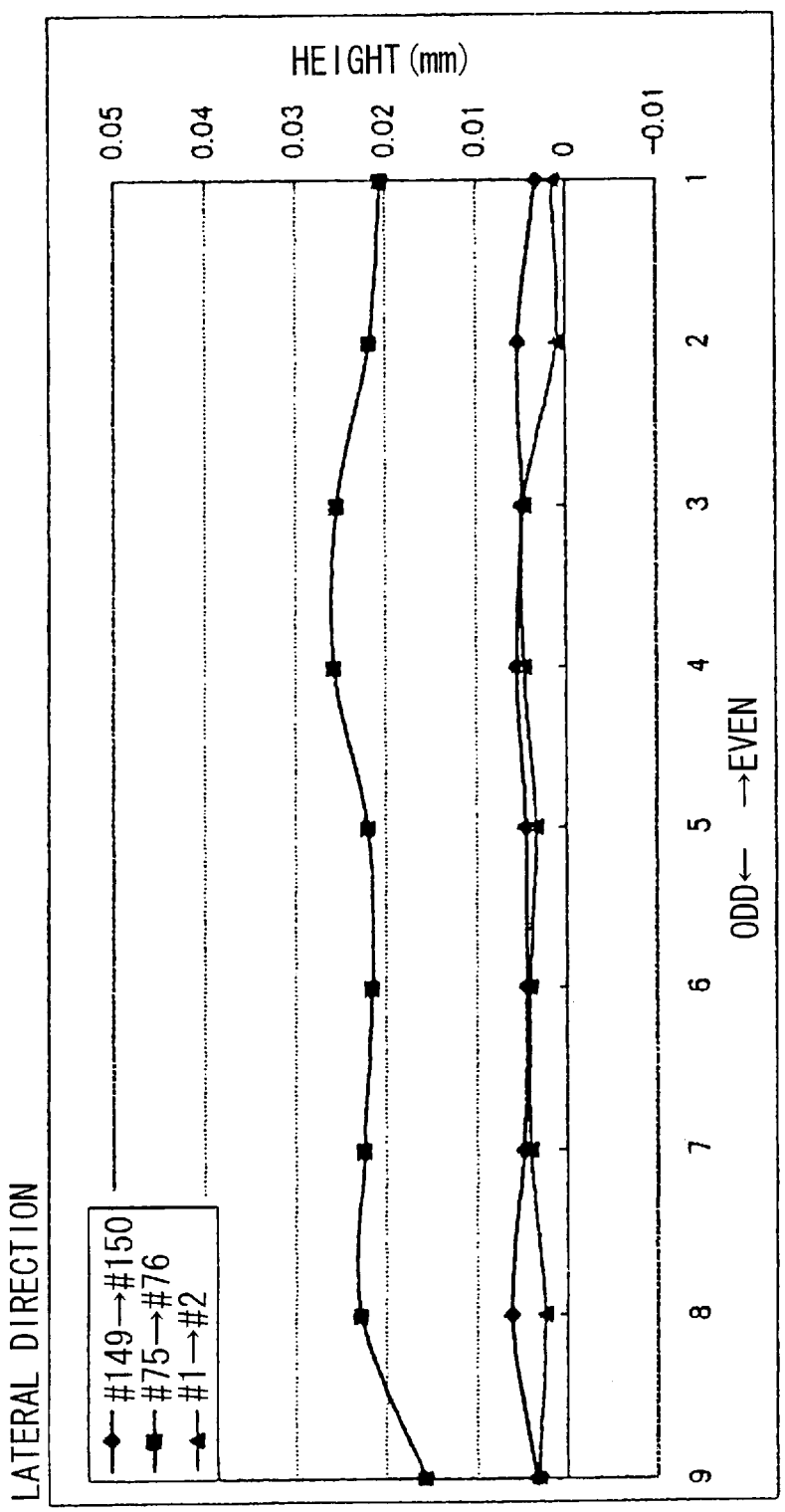
FIG. 31A is a line graph showing inclination of the surface in a lateral direction, by eight sections, in FIG. 30A.

FIG. 31A is a line graph showing inclination of the surface in the lateral direction, by eight sections, in FIG.

Figure 31B:
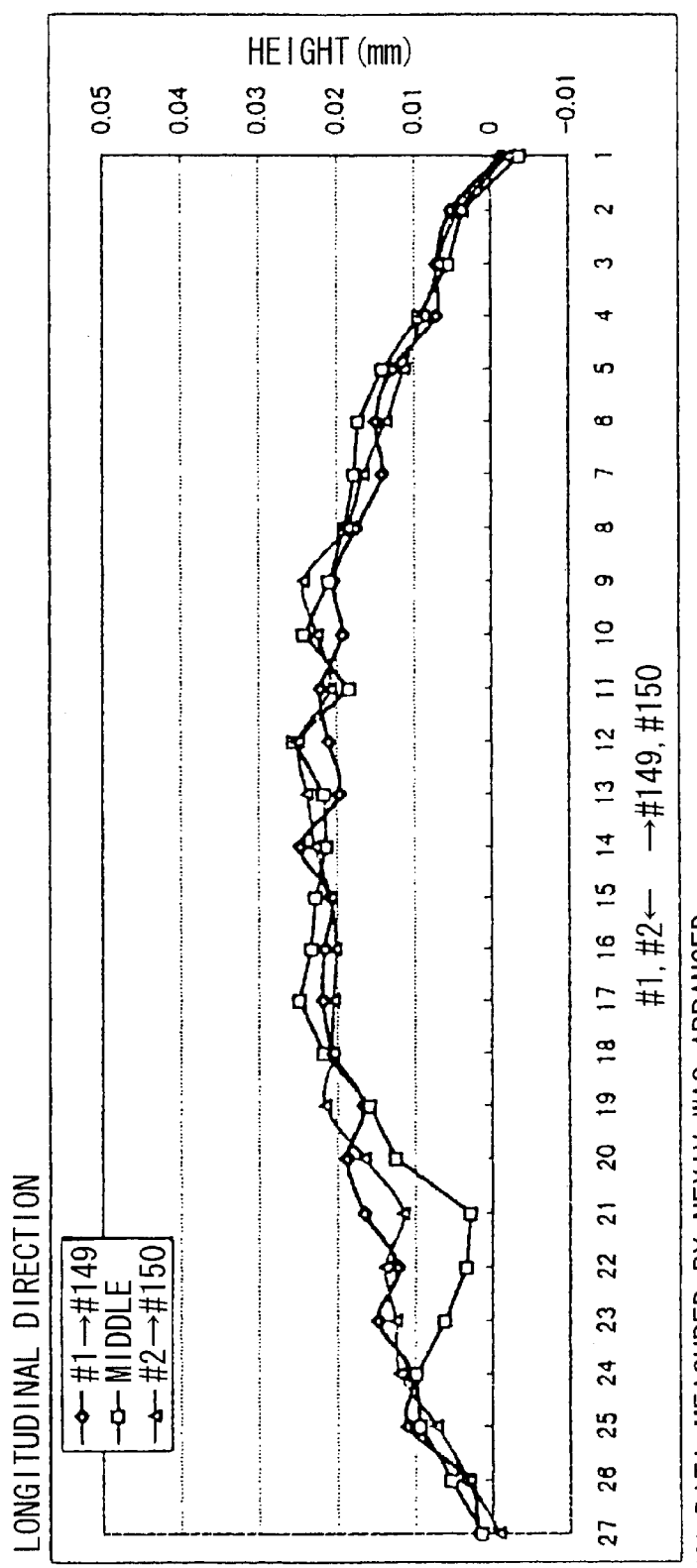
FIG. 31B is a line graph showing inclination of the surface in a longitudinal direction, by 26 sections, in FIG. 30A.
Figure 32:
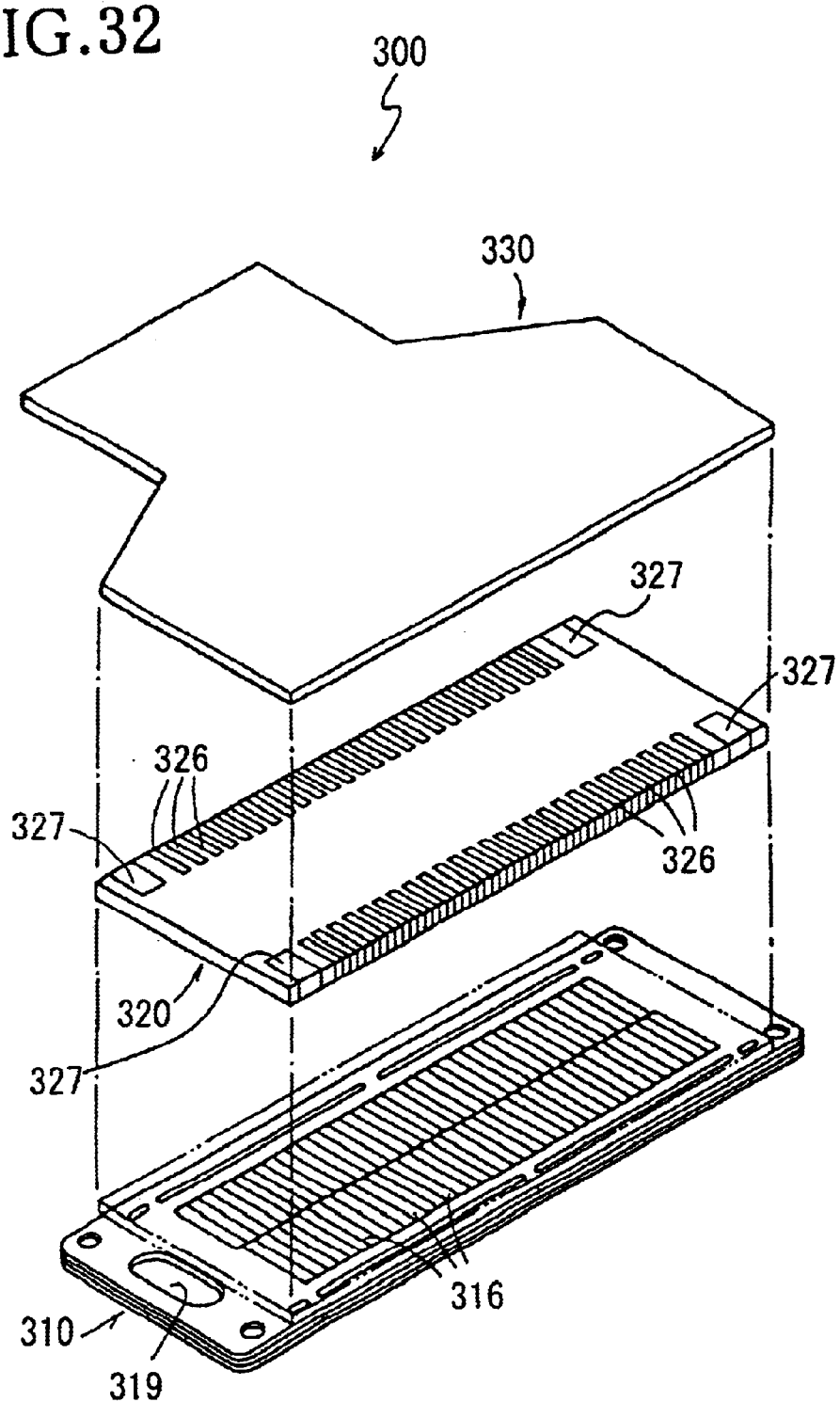
FIG. 32 is a disassembled perspective view of a conventional ink jet print head.
Figure 33:
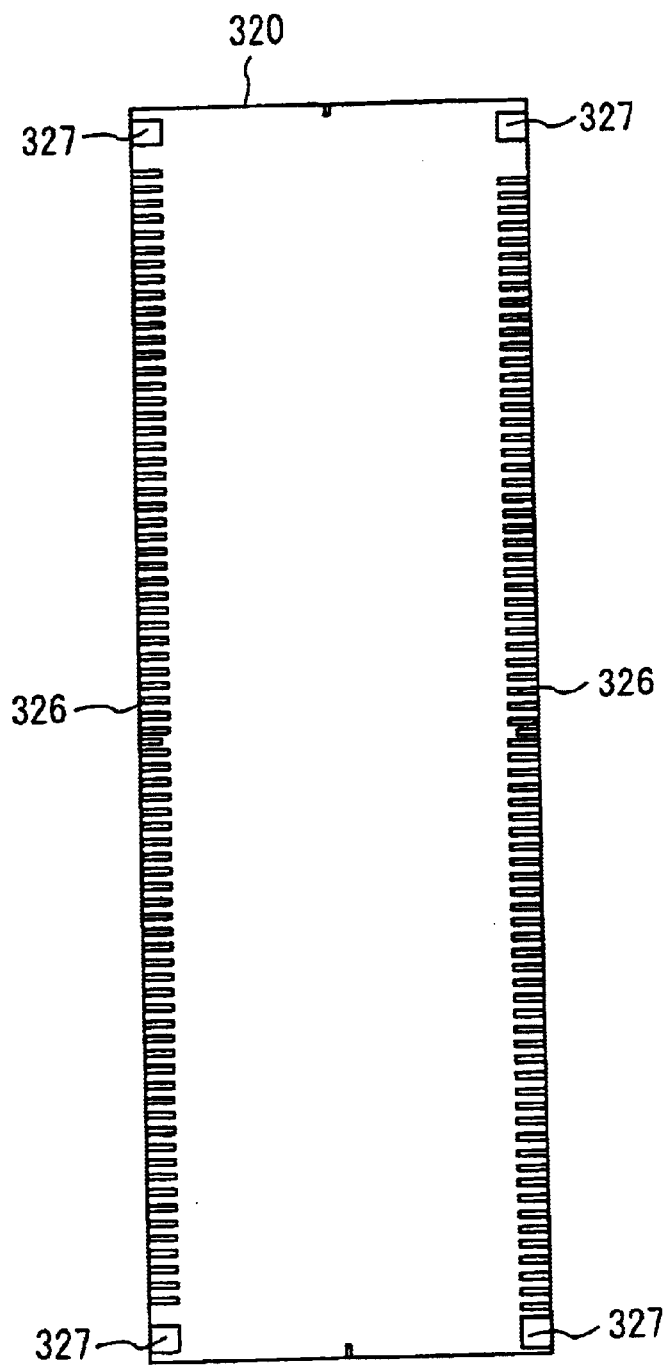
FIG. 33 is a plan view of a conventional plate-like piezoelectric actuator.
Figure 34:
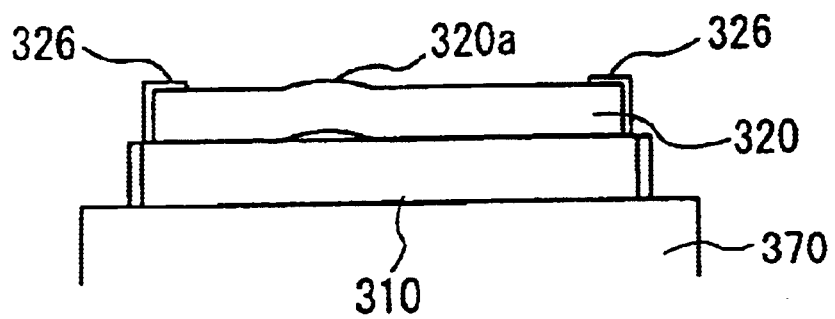
FIG. 34 is a diagram showing a process of adhering the conventional plate-like piezoelectric actuator to the cavity plate 110.
Figure 35:
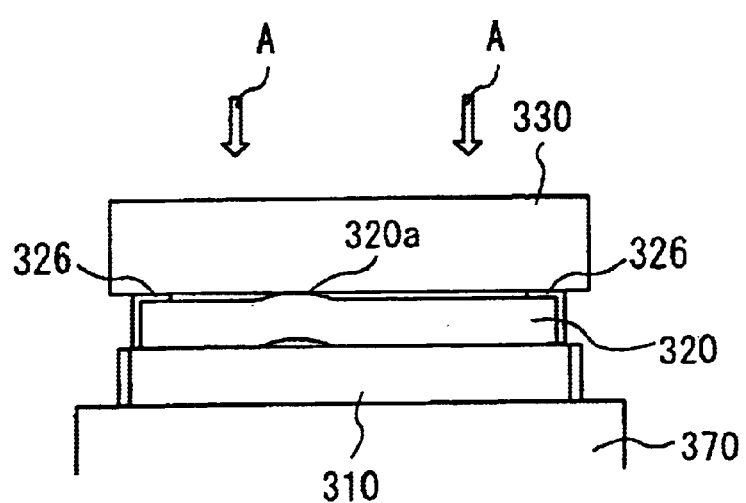
FIG. 35 is a diagram showing the process of adhering the plate-like piezoelectric actuator to the cavity plate.

30A. The line graph shows inclination of the surface in the lateral direction, by eight sections, at a position #1–#2 corresponding to the pressure chambers and nozzles #1–#2 positioned in a nearest side, a position #75–#76 corresponding to the pressure chambers and nozzles #75–#76 positioned in a middle in the longitudinal direction and a position #149–#150 corresponding to the pressure chambers and nozzles #149–#150 positioned in a farthest side. FIG. 31B is a line graph showing inclination of the surface in the longitudinal direction, by 26 sections, in FIG. 30A, at a position #2–150 corresponding to the pressure chambers and nozzles #2–#150, a middle, and at a position #1–#149 corresponding to the pressure chambers and nozzles #2–#150. These data are measured by NEXIV.

As seen from FIG. 31B, a vicinity of a section #21 showing the middle of the surface is depressed as compared with that of the positions #2–#150 and #1–#149. However, the difference of the height of the section #21 between the middle and the positions #2–#150 and #1–#149 is 10 μm or less.

Thus, as seen from FIGS. 30A, 30B, 31A and 31B, in the piezoelectric actuators 220 fabricated according to the method of this embodiment, the height of the projections of their surfaces is 10 μm or less and the depth of the depressions is 10 μm or less in the area of 5 mm². Therefore, the difference of the height between the projection and the depression is 20 μm or less.

Accordingly, the piezoelectric actuator 220 with the as-is state of a sintered body can be bonded to the cavity plate 210 without grinding the surface of the piezoelectric actuator 220. Consequently, the operating efficiency in the process of fabricating the piezoelectric actuator 220 can be improved and the fabricating cost can be also reduced.

As is the case with the second embodiment, pseudo electrodes having the same thickness as the surface electrodes 226, 227 can be provided between the surface electrodes 226 and 227 provided on the upper surface of the topmost piezoelectric sheet 223.

While the invention has been described in detail with reference to specific embodiments thereof, it would be apparent to those skilled in the art that various changes and modifications may be made therein without departing from the spirit of the invention.

What is claimed is:

1. An ink jet print head, comprising:
a cavity plate that includes a plurality of nozzles and a plurality of pressure chambers communicating with the respective nozzles; and
a plate-like piezoelectric actuator formed into a single, one-piece laminated structure by laminating a plurality of piezoelectric sheets including a plurality of internal electrodes which are driving electrodes and common electrodes formed in the laminated structure at positions so as to be aligned with the respective pressure chambers, the one-piece laminated piezoelectric actuator with internal electrodes sintered and bonded to the cavity plate so as to close the pressure chambers provided in the cavity plate, wherein each of the piezoelectric sheets has a thickness of between 5–40 μm, and each of the driving electrodes has a width of between 50–500 μm.

2. The ink jet print head according to claim 1, wherein each of the piezoelectric sheets has a thickness of between 15–30 μm.

3. The ink jet print head according to claim 2, wherein the driving electrodes are formed at positions with respect to the pressure chambers, and the common electrodes are formed at a position to cover the pressure chambers, wherein each of the driving electrodes has thickness of between 0.7–5 μm.

4. The ink jet print head according to claim 3, wherein each of the driving electrodes has a width of between 80–200 μm and a thickness of between 1–3 μm.

5. The ink jet print head according to claim 2, wherein the piezoelectric actuator has a flatness of 30 μm or less, which is a difference of height between projections and depressions formed on the piezoelectric actuator at its surface to which the cavity plate is bonded.

6. The ink jet print head according to claim 5, wherein the piezoelectric actuator has the flatness of 30 μm or less in an area of 5 mm².

7. An ink jet print head, comprising:
a cavity plate that includes a plurality of nozzles and a plurality of pressure chambers communicating with the respective nozzles, each pressure chamber being defined between beams; and
a plate-like piezoelectric actuator formed into a single, one-piece laminated structure by laminating a plurality of piezoelectric sheets including a plurality of internal electrodes which are driving electrodes and common electrodes formed in the laminated structure at positions so as to be aligned with the respective pressure chambers, the one-piece laminated piezoelectric actuator with internal electrodes sintered and bonded to the cavity plate so as to close the pressure chambers provided in the cavity plate, wherein each of the piezoelectric sheets has a thickness of between 5–40 μm, each of the driving electrodes has a width of between 50–500 μm, and a width of each beam is larger than 20 μm.

* * * * *